(12) United States Patent
Ishihara et al.

(10) Patent No.: US 9,595,437 B2
(45) Date of Patent: Mar. 14, 2017

(54) METHOD OF FORMING SILICON ON A SUBSTRATE

(71) Applicant: Technische Universiteit Delft, Delft (NL)

(72) Inventors: Ryoichi Ishihara, Delft (NL); Miki Trifunovic, Delft (NL); Michiel Van Der Zwan, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 14/787,221

(22) PCT Filed: Apr. 28, 2014

(86) PCT No.: PCT/NL2014/050275
§ 371 (c)(1),
(2) Date: Oct. 26, 2015

(87) PCT Pub. No.: WO2014/175740
PCT Pub. Date: Oct. 30, 2014

(65) Prior Publication Data
US 2016/0118252 A1    Apr. 28, 2016

(30) Foreign Application Priority Data

Apr. 26, 2013  (NL) .................... 2010713

(51) Int. Cl.
*H01L 21/02* (2006.01)
*C30B 7/00* (2006.01)
(Continued)

(52) U.S. Cl.
CPC .......... *H01L 21/02532* (2013.01); *C30B 7/00* (2013.01); *C30B 7/14* (2013.01);
(Continued)

(58) Field of Classification Search
CPC combination set(s) only.
See application file for complete search history.

(56) References Cited

U.S. PATENT DOCUMENTS

| | | |
|---|---|---|
| 6,541,354 B1 | 4/2003 | Shimoda et al. |
| 7,972,960 B1 | 7/2011 | Suguro et al. |
| | (Continued) | |

FOREIGN PATENT DOCUMENTS

| | | |
|---|---|---|
| EP | 1087428 A1 | 3/2001 |
| WO | 2009086105 A1 | 7/2009 |
| | (Continued) | |

OTHER PUBLICATIONS

Tanaka, Hideki et al., Spin-On n-Type Silicon Films Using Phosphorous-doped Polysilanes, Japanese Journal of Applied Physics, Japan Society of Applied Physics, Toyko, JP, vol. 46, No. 36, Jan. 1, 2007, 3 pages.

*Primary Examiner* — Kyoung Lee
*Assistant Examiner* — Ratisha Mehta
(74) *Attorney, Agent, or Firm* — St. Onge Steward Johnston and Reens, LLC

(57) ABSTRACT

A method for forming a silicon layer using a liquid silane compound is described. The method includes the steps of: forming a first layer on a substrate, preferably a flexible substrate, the first layer having a (poly)silane; and, irradiating with light having one or more wavelength within the range between 200 and 400 nm for transforming the polysilane in silicon, preferably amorphous silicon or polysilicon.

17 Claims, 23 Drawing Sheets

(51) Int. Cl.
*C30B 29/06* (2006.01)
*C30B 7/14* (2006.01)
*H01L 31/18* (2006.01)
*H01L 31/20* (2006.01)

(52) U.S. Cl.
CPC ........ *C30B 29/06* (2013.01); *H01L 21/02422* (2013.01); *H01L 21/02623* (2013.01); *H01L 21/02686* (2013.01); *H01L 31/182* (2013.01); *H01L 31/202* (2013.01)

(56) References Cited

U.S. PATENT DOCUMENTS

| | | | |
|---|---|---|---|
| 2003/0229190 A1* | 12/2003 | Aoki | C01B 33/04 526/279 |
| 2011/0240350 A1* | 10/2011 | Meinder | B82Y 10/00 174/258 |
| 2011/0240997 A1 | 10/2011 | Rockenberger et al. | |

FOREIGN PATENT DOCUMENTS

| WO | 2009142991 A1 | 11/2009 |
|---|---|---|
| WO | 2013034312 A1 | 3/2013 |

\* cited by examiner

FIG. 2

| 300 1x | 300 10x | 300 25x | 300 50x | 300 100x | ME 4 | ME 11 | ME 19 |
| 250 1x | 250 10x | 250 25x | 250 50x | 250 100x | ME 3 | ME 10 | ME 18 |
| 200 1x | 200 10x | 200 25x | 200 50x | 200 100x | ME 2 | ME 9 | ME 17 |
| 150 1x | 150 10x | 150 25x | 150 50x | 150 100x | ME 1 | XXX | ME 16 |
| 100 1x | 100 10x | 100 25x | 100 50x | 100 100x | 400 10x | ME 8 | ME 15 |
| 75 1x | 75 10x | 75 25x | 75 50x | 75 100x | 300 10x | ME 7 | ME 14 |
| 50 1x | 50 10x | 50 25x | 50 50x | 50 100x | 400 1x | ME 6 | ME 13 |
| 25 1x | 25 10x | 25 25x | 25 50x | 25 100x | 300 1x | ME 5 | ME 12 |

202

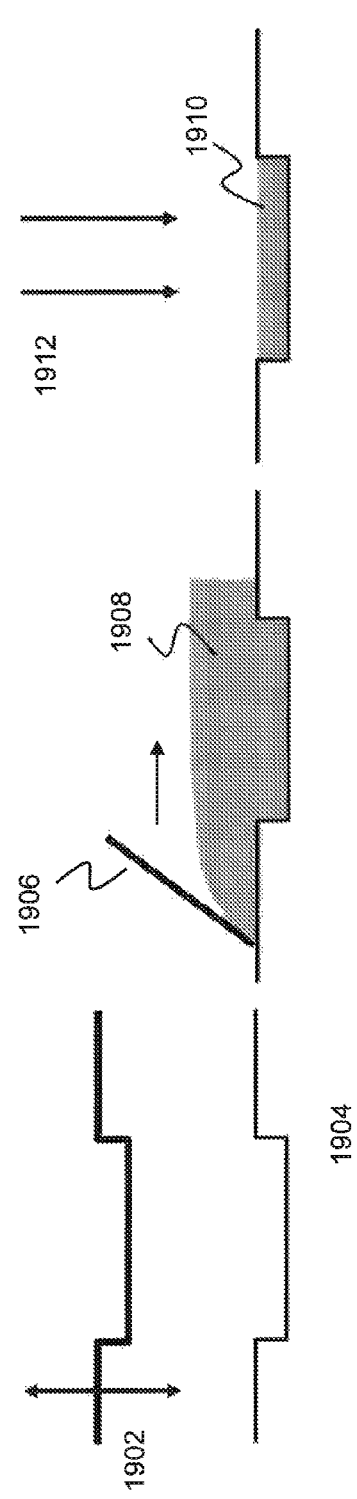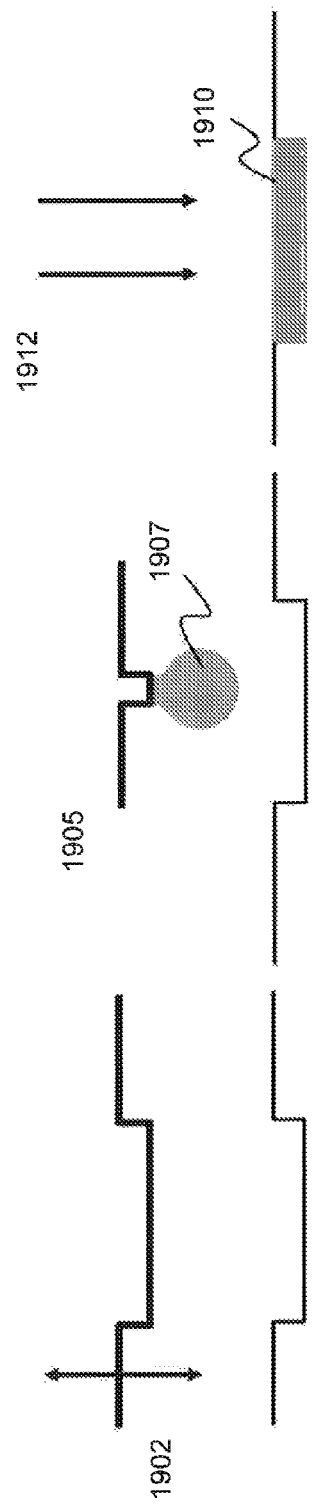
FIG. 19A
FIG. 19B

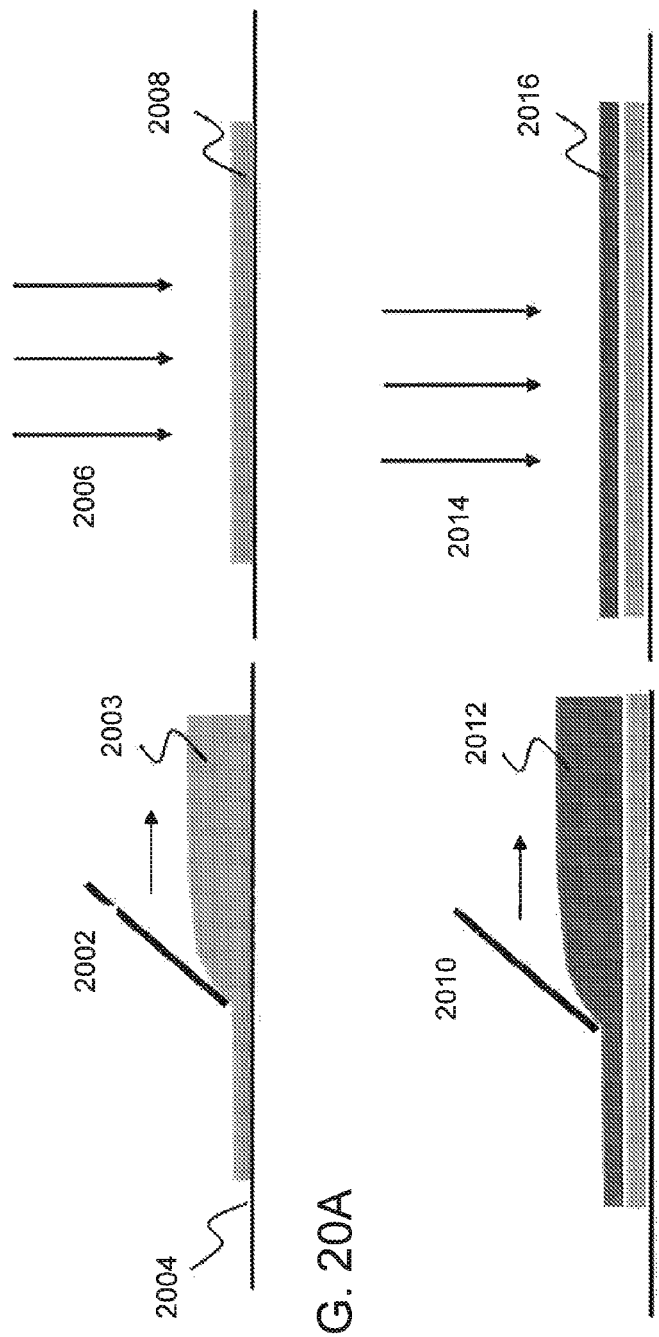

METHOD OF FORMING SILICON ON A SUBSTRATE

FIELD OF THE INVENTION

The invention relates to the formation of silicon on a substrate, and, in particular, though not exclusively, to a low-temperature method for forming silicon on a substrate using a liquid silane compound.

BACKGROUND OF THE INVENTION

Semiconductor devices, such as diodes and transistors are essential components for electronic devices. A continuing demand exists for new, alternative, less expensive and/or improved manufacturing processes for their production. Currently, a particular interest exists in processes for the production of flexible electronics components for use e.g. in RFID tags, flexible LED and LCD displays and photovoltaics. A very promising technique for producing flexible electronics is the so-called roll-to-roll (R2R) fabrication technique (also known as web processing or reel-to-reel processing) wherein thin-films are deposited on a flexible (plastic) substrate and processed into electrical components in a continuous way.

In an R2R process printing techniques (e.g. imprint, inkjet, or screen printing) and coating techniques (e.g. roll, slit coating or spray coating) are used in order to achieve high-throughput, low-cost manufacture of semiconducting devices, including photovoltaic cells and TFT circuitry for displays. Such techniques include the use of inks, i.e. liquid semiconductor, metal and dielectric precursors, which can be deposited on the substrate using a simple coating or printing technique. This way, flexible electronics may be fabricated at a fraction of the cost of traditional semiconductor manufacturing methods.

In order to realize flexible electronics for high-performance applications, such as UHF RFIDs and flexible displays, low-cost and high-throughput formation of high-mobility thin-film semiconductor layers on a flexible substrate is required. Further, the manufacturing process should support formation of structures having small feature size and high alignment accuracy. Commercially interesting candidates for a flexible plastic substrate material include polyethylene naphthalate (PEN) and polyethylene terephthalate (PET). These materials are low-cost materials with a high optical transparency and chemically compatible with most semiconductor processes. The maximum processing temperatures of these materials are however relatively low approximately (approx. 200° C. for PEN and 120° C. for PET).

Several liquid-based techniques for forming a semiconducting coating on a substrate are known. Organic semiconductor materials may be used in a low-temperature deposition technique in order to realize "plastic" TFT circuitry for LCD applications or "plastic" photovoltaic cells. However, the electron mobility and reliability of these organic semiconductors are still inferior to their amorphous silicon counterparts (approx. 1 $cm^2/V_s$) so that integration of peripheral driver and control circuits is difficult to achieve. Alternatively, amorphous metal-oxide semiconductors like In—Ga—Zn—O (a-IGZO) may be formed on a plastic substrate using a low-temperature solution-based process. Although, the electron mobility of an a-IGZO layer is higher than a-Si, it is still limited to 20 $cm^2/V_s$. Furthermore, the hole mobility is very low so that p-type metal-oxide semiconductor TFTs cannot be made. The inability to realize circuitry in a CMOS configuration poses a serious limitation on the use of this material in commercial applications. Hence, in summary, plastic and a-IGZO semiconducting materials are still substantially inferior to poly-crystalline silicon that offers highly stable electrical properties and sufficiently high mobility (>100 $cm^2/V_s$) for electronics applications.

Techniques for liquid-based formation of silicon are known. For example, U.S. Pat. No. 6,541,354 and US2003/0229190 describe processes for forming silicon films using a solution containing a cyclic silane compound such as cyclopentasilane (CPS) and a solvent. Typically, the solution is spin-coated onto a substrate and subjected to a drying step in order to remove the solvent. Thereafter, a combined UV treatment and annealing step of the coated substrate at a temperature of around 300° C. is used to transform the coating layer in 30 minutes into an amorphous silicon layer. A further annealing step at 800° C. or exposure of the amorphous silicon layer to laser light may covert the amorphous layer into a poly-crystalline layer.

Further development of this process has been reported in various documents. For example, Zhang et. al. reported in their article "single-grain Si TFTs on flexible polyimide substrate from doctor-blade coated cyclopentasilane" the fabrication of TFTs on polyimide substrate by exposing a CPS coated substrate comprising small holes ("grain filters") for one hour in a nitrogen atmosphere to at a temperature of 350° C. in order to transform the coating into amorphous Silicon. A multi-shot laser exposure was used in order to transform the amorphous silicon into a crystalline silicon layer wherein dehydrogenation of the layer was achieved by gradually increasing the energy density from 50 to 350 mJ/cm2 while decreasing the number of the shots for each energy density from 100 to 1.

The prior art thus describes the formation of poly-silicon films on a substrate on the basis of liquid silane compound based processes that include coating the substrate with liquid silane compound and transforming the coating into amorphous silicon by exposing the substrate with the coating to an annealing step at temperatures around 300° C. to 350° C. for a relatively long period of time (e.g. 10-30 minutes). In some cases before annealing the coating may be exposed to UV radiation in order to transform e.g. cyclic silane compounds such as CPS into polysilane. A subsequent laser irradiation step or a high-temperature pyrolysis step is used for transforming the amorphous silicon into polycrystalline silicon. Although high quality polycrystalline films were achieved, the processing temperature not sufficiently low enough for plastic substrate materials such as PET and PEN. In addition, the dehydrogenation step required many number of shots, possibly causing low throughput in the production.

Hence, there is a need for in the art for fast and efficient low-temperature formation of silicon using a liquid silicon precursor. In particular, there is a need in the art for efficient low temperature formation of amorphous, microcrystalline and poly-crystalline layers on plastic substrates using a liquid-based process.

SUMMARY OF THE INVENTION

It is an objective of the invention to reduce or eliminate at least one of the drawbacks known in the prior art. In one aspect the invention may relate to forming silicon, preferably a silicon layer, on a substrate comprising: forming one or more layers on a substrate using one or more liquid silane compounds; directly transforming at least part of said one or more layers into silicon, preferably said silicon comprising amorphous, microcrystalline, polycrystalline and/or single crystalline silicon, by exposing at least part of said one or more layers to light, preferably laser light, more preferably one or more laser light pulses, comprising one or more wavelengths within the range between 100 nm and 800 nm, preferably between 200 nm and 400 nm.

It has been surprisingly found that one or more layers of silane compounds (e.g. coating of one or more silane compounds) can be directly transformed by (laser) light into silicon without thermally annealing the substrate (either before or during the transformation). Hence, the substrate does not need to be subjected to annealing temperatures that are higher than the maximum handling temperature of plastic substrates such as polyamide, PEN or PET.

When using laser light in the UV range, the layers can be effectively transformed into solid-state silicon on the basis of only one or more very short pulses. Such laser pulses may have a pulse width within 10-500 ns, hence the transformation of the (poly)silane compounds occurs at a very short time-scale, thus providing a very fast process of forming silicon on the basis of a (poly)silance coating.

In an embodiment, said one or more layers are directly transformed into silicon without exposing said substrate to an annealing temperature higher than 250° C., preferably 200° C., more preferably 150° C., even more preferably 100° C. In another embodiment said one or more layers are directly transformed into silicon without exposing said substrate to a temperature anneal.

In another aspect, the invention may relate to a method for forming silicon, preferably a silicon layer, on a substrate comprising: forming one or more layers on a substrate, preferably a flexible substrate, using a liquid silane compound; and, irradiating at least part of said one or more layers with light comprising one or more wavelengths within the range between 100 and 800 nm, preferably 200 and 400 nm, for transforming at least part of said liquid (poly)silane in silicon. In an embodiment, at least part of said layers are transformed in amorphous, microcrystalline, polycrystalline silicon and/or single crystalline silicon.

The method provides a low-temperature process for forming different types of silicon, e.g. an amorphous, microcrystalline, polycrystalline and/or single crystalline silicon, on a substrate by simply exposing a coating comprising silane compounds to irradiation, preferably UV irradiation of a pulsed laser.

Within this application, a "low-temperature process" refers to a process wherein the substrate is not exposed to an annealing temperature higher around 250° C., i.e. the maximum handling temperature of plastic substrates such as polyamide, PEN or PET.

Hence, instead the known processes in the prior at wherein an amorphous silicon layer is formed on the basis of a relatively long (at least 10 minutes or longer) thermal anneal of a (poly)silane coating at relatively high temperatures (300° C. or higher), a silane coating may be exposed to laser radiation on the basis of a certain exposure recipe in order to directly transform the silane coating into different types of silicon: amorphous, microcrystalline, polycrystalline and/or single crystalline silicon. Moreover, since no thermal anneal of the substrate is necessary, the process provides a low-temperature laser crystallization process which may form the basis for the fabrication of TFTs and solar cells on flexible (plastic) substrates.

In an embodiment, exposing at least part of said one or more layers to said light after thermally annealing said one or more layers at a low-temperature between 80 and 270° C., preferably between 90 and 260° C., more preferably between 100 and 250° C.; and/or, exposing said first layer to said light without thermally annealing said one or more layers.

In an embodiment, forming said one or more layers may comprise: coating at least part of substrate with at least one liquid cyclic silane compounds; exposing at least part of said coating with UV irradiation for transforming at least part of said cyclic silane compounds in one or more polysilane compounds;

In an embodiment, the light that is used for transforming at least part of said one or more layers into silicon is generated by a high- or low-pressure mercury lamp, a rare-earth gas discharge lamp or a (pulsed) laser, preferably a (pulsed) YAG laser, an argon laser or an excimer laser.

In an embodiment, exposing at least part of said one or more layers may comprise: exposing at least part of said one or more layers to (laser) light; preferably one or more pulses of laser light, wherein said light has an energy an energy density of 75 mJ/cm2 or more in order to transform at least part of said one or more layers into silicon.

In an embodiment, exposing at least part of said one or more layers may comprise: exposing at least part of said one or more said layer to one or more laser pulses wherein the energy density of said pulses is selected between 10 and 800 mJ/cm2, preferably 20 and 500 mJ/cm2, more preferably 25 and 300 mJ/cm2.

In an embodiment, exposing at least part of said one or more layers may comprise: exposing at least part of said one or more layers to one or more first laser pulses of an energy density selected between 20 and 100 mJ/cm2, preferably 25 and 70 mJ/cm2; and, to one or more second laser pulses having an energy density selected between 120 and 350 mJ/cm2, preferably between 140 and 300 mJ/cm2.

In an embodiment at least part of said one or more layers may be exposed to one or more laser pulses such that at least part of said silane is transformed in to silicon, preferably amorphous, microcrystalline or polycrystalline silicon, more preferably said polycrystalline silicon comprising an average grain size between 5 and 500 nm, preferably 20 nm and 300 nm.

In an embodiment forming said one or more layers on said substrate may comprise: coating said substrate with a liquid silane compound or doped liquid silane compound, preferably said liquid silane compound being defined by the general formula $Si_nX_m$, wherein X is a hydrogen; n is an integer of 5 or greater, preferably an integer between 5 and 20; and m is an integer equal to n, 2n−2, 2n or 2n+1; more preferably said liquid silane compound comprising cyclopentasilane (CPS; $Si_5H_{10}$), cyclohexasilane ($Si_6H_{12}$) and/or neopentasilane ($Si_5H_{12}$); and, preferably said doped liquid silicon precursor being defined by the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

In an embodiment, said liquid silane compound or said doped liquid silane compound may be formed on said substrate in a substantially pure form (without the addition of one or more solvents).

In an embodiment said substrate may be a plastic substrate, preferably said plastic comprising polyamide, PEN or PET or derivatives thereof.

In an embodiment forming said first layer on a substrate may comprise: depositing a liquid silane compound on said substrate using and ink jet technique of a doctor blade technique.

In an embodiment forming said first layer on said substrate may comprise: forming an recess and/or nanohole in said substrate, preferably using an imprint technique; filling said recess at least part with a liquid silane compound.

In an embodiment said method may further comprise: forming a second layer over at least part of said first layer, said second layer comprising a liquid (poly)silane; and, irradiating said second layer with light comprising one or more wavelength within the range between 100 and 800 nm for transforming said (poly)silane compound in silicon, preferably amorphous silicon, polycrystalline silicon and/or single crystalline silicon.

In a further aspect, the invention may further relate to the use of the method as described above in a 3D printing technique.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIG. 2 depicts an exposure map for use in pulsed laser crystallization.

FIGS. 19A and 19B depict a method for forming a thin film on a flexible substrate according to an embodiment of the invention.

FIG. 20A-20B depicts a method for forming a thin film multilayer on a substrate according to an embodiment of the invention.

DETAILED DESCRIPTION OF THE INVENTION

Figure 1:
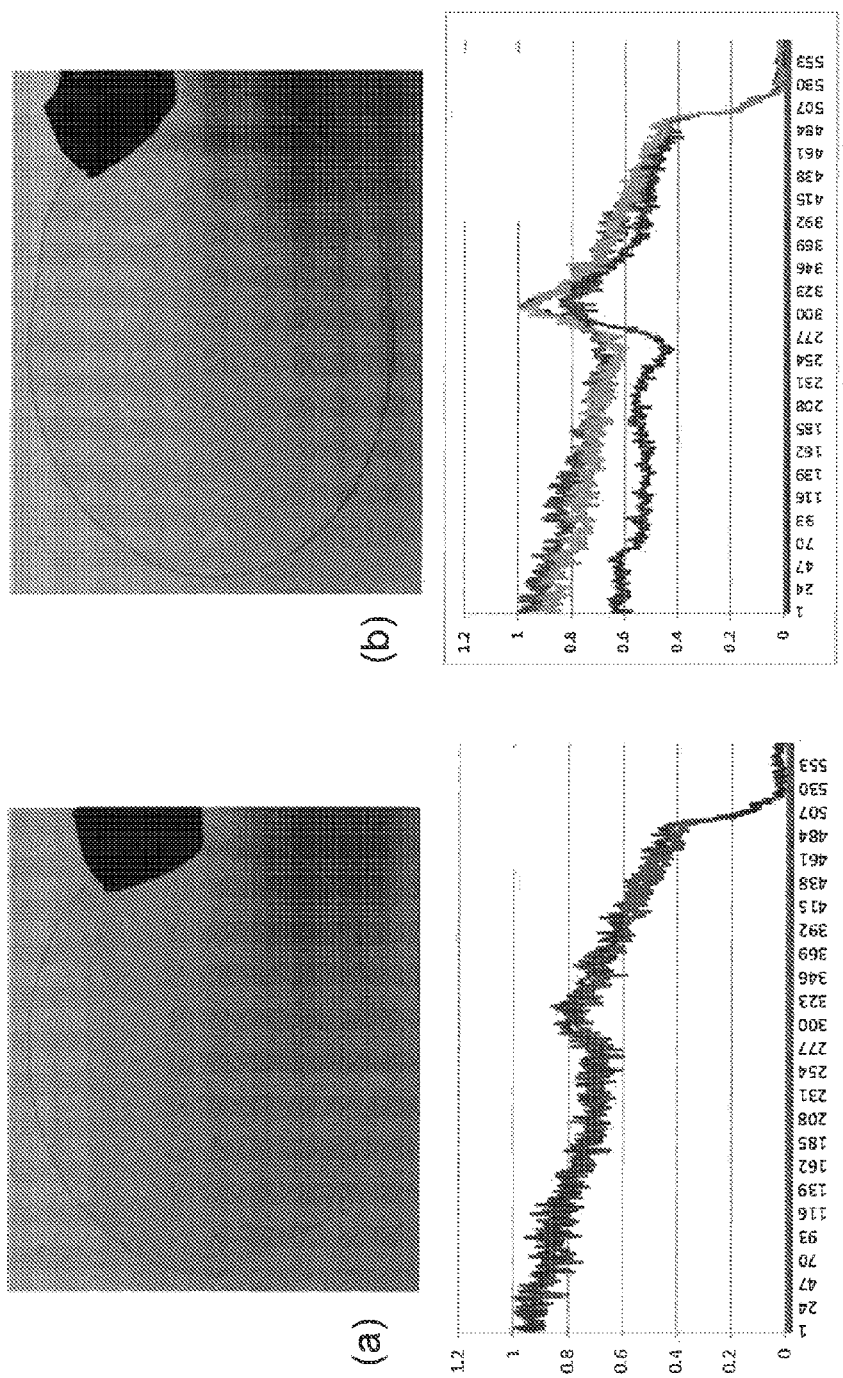
FIG. 1A-1D depict photos of annealed coated glass substrate and associated Raman spectra.
Figure 1:
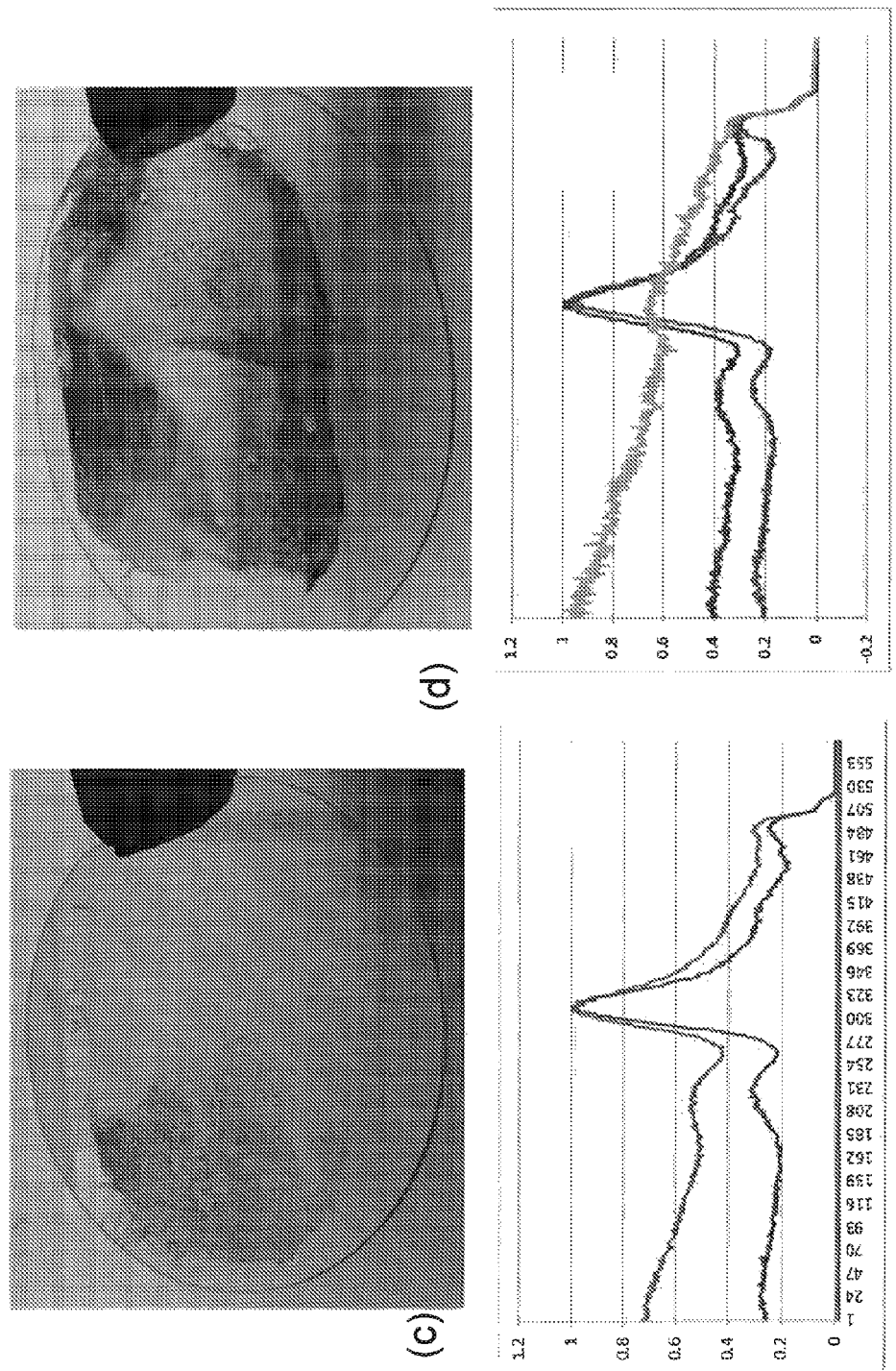

FIG. 1A-1D depict the experimental results of a combined UV and thermal treatment of a CPS coating. In particular, FIG. 1A-1D show photos and Raman scattering results of UV-irradiated CPS coated substrates that were annealed at different temperatures. Quartz wafers were coated with pure CPS using a doctor-blade coating technique in a low-oxygen environment (below 10 ppm). In an embodiment, the CPS coated substrate may be irradiated with UV radiation for a predetermined time. The UV radiation may be used in order to break the CPS rings and to transform at least part of the CPS in (low-order) polysilanes, which are soluble in the CPS. Hence, by UV irradiating the CPS coating a coating may be formed comprising polysilane or a mixture of polysilane and CPS (a cyclic silane). For the purpose of this disclosure, a polysilane coating or a mixed polysilane-cyclic silane coating will be referred to as a polysilane coating.

In an embodiment, the coating may be irradiated with an UV light having an intensity selected between 1 and 100 mW, preferably between 2 and 50 mW, more preferably between 5 and 20 mW. Depending on the selected intensity and the desired degree of polymerization, the coating may be exposed to UV light for a period between 1 and 100 minutes, preferably between 2 and 50 minutes, more preferably between 5 and 40 minutes. The polymerization process transforms the CPS into a polysilane coating or a mixed polysilane-CPS coating that is more viscous and more stable for handing in subsequent processing steps. Moreover, the formation of polysilane increases the boiling temperature of the coating so that the coating can be annealed at temperatures higher than the boiling temperature of CPS (around 194° C.). The thickness of the polysilane thin-film layers may be selected between 50 and 5000 nm, preferably between 50 and 4000 nm, more preferably between 50 and 2000 nm or between 50 and 1000 nm.

In an embodiment, the polysilane coating may be annealed by subjecting the substrate with the coating to a predetermined temperature. FIG. 1A-1D depicts the results of a polysilane coated glass substrates for various annealing temperatures ranging from 150° C. up to 350° C. The annealed coatings were analyzed using Raman scattering.

The results of FIG. 1A show that for samples annealed at temperatures around 200° C. or below no clear sign of amorphous Silicon (broad peak at around 320 cm$^{-1}$) was found. When increasing the annealing temperature, the formation of amorphous silicon starts to appear around an annealing temperature of 250° C. The Raman measurements show that the quality of the amorphous silicon increases when increasing the temperatures up to around 300° C. (FIG. 1C) or higher (such as 350° C. in FIG. 1D).

When increasing the annealing temperature, the color of the coating changes thereby providing an indication that the coating is transforming during the annealing. When increasing the annealing temperature, the molecular structure of the polysilane change: polysilane molecules may break and form cross-connections with neighboring molecules thereby forming an amorphous silicon network. During the annealing process, the coating may turn from a colorless (transparent) coating into a white coating around 200° C. indicating the formation of high-order polysilane. Further, increasing the annealing temperature from 200° C. to 300° C. turns the color of the coating into yellow, followed by maroon for annealing temperatures higher than 330° C. These color changes indicated that a substantial portion of the coating is transformed into amorphous silicon at annealing temperatures around 300° C. When increasing the temperature up to 400° C. and higher, the coating obtains a silver color.

Hence, from the above it follows that the formation of an amorphous silicon layer (that is normally needed in order to form polysilicon layer using a subsequent laser crystallization step) requires an annealing step by subjecting the substrate with the silane based coating to temperatures that are higher than the boiling temperature of CPS and/or that are higher than the maximum handling temperature of plastic substrates such as polyamide, PEN or PET.

In order to address this problem, polysilane coatings were prepared at a low temperature. The substrate with the polysilane coating was either not subjected to a temperature annealing step or subjected to an low-temperature annealing step, i.e. an annealing step lower than 300° C. In an embodiment, a polysilane coating may be annealed at temperatures of around 200° C. or lower, preferably 150° C. or lower. In another embodiment, a silane-based coating, preferably a polysilane coating, is not subjected to a temperature annealing step. The thus prepared polysilane coatings were then subjected to a laser annealing step wherein the coating was irradiated by radiation comprising wavelengths between 100 and 600 nm, preferably between 200 and 400 nm, more preferably 250 and 350 nm.

As will be described hereunder in more detail, it was surprisingly found that when irradiating the silane-based coating, preferably coating comprising polysilane, with laser light of a predetermined wavelength range, the polysilane layer was directly transformed in a solid-state silicon layer, such as an amorphous, microcrystalline, poly-silicon layer.

While the examples below are described with reference to cyclopentasilane, the invention is by no limited to this material. In particular, the invention may be used with liquid semiconductor precursors comprising one or more silane compounds. In an embodiment, a silane compound may be represented by the general formula $Si_nX_m$, wherein X is a hydrogen; n is preferably an integer of 5 or greater and is more preferably an integer between 5 and 20; m is preferably an integer of n, 2n–2, 2n or 2n+1; wherein part of the hydrogen may be replace by a halogen.

Examples of such silane compounds are described in detail in EP1087428, which is hereby incorporated by reference into this application. Examples of the compounds of m=2n+2 include silane hydrides, such as trisilane, tetrasilane, pentasilane, hexasilane, and heptasilane, and substituted compounds thereof in which hydrogen atoms are partially or completely replaced with halogen atoms. Examples of m=2n include monocyclic silicon hydride compounds, such as cyclotrisilane, cyclotetrasilane, cyclopentasilane, silylcyclopentasilane, cyclohexasilane, silylcyclohexasilane, and cycloheptasilane; and halogenated cyclic silicon compounds thereof in which hydrogen atoms are partially or completely replaced with halogen atoms, such as hexachlorocyclotrisilane, trichlorocyclotrisilane, coctachlorocyclotetrasilane, tetrachlorocyclotetrasilane, decachlorocyclopentasilane, pentachlorocyclopentasilane, dodecachlorocyclohexasilane, hexachlorocyclohexasilane, tetradecachlorocycloheptasilane, heptachlorocycloheptasilane, hexabromocyclotrisilane, tribromocyclotrisilane, pentabromocyclotrisilane, tetrabromocyclotrisilane, octabromocyclotetrasilane, tetrabromocyclotetrasilane, decabromocyclopentasilane, pentabromocyclopentasilane, dodecabromocyclohexasilane, hexabromocyclohexasilane, tetradecabromocycloheptasilane, and heptabromocycloheptasilane. Examples of compounds of m=2n–2 include dicyclic silicon hydride compounds, such as 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, and spiro[6,6]tridecasilane; substituted silicon compounds in which hydrogen atoms are partly or completely replaced with SiH3 groups or halogen atoms. Moreover, examples of compounds of m=n include polycyclic silicon hydride compounds, such as Compounds 1 to 5 represented by the following formulae, arid substituted silicon compounds thereof in which hydrogen atoms are partially or completely replaced with SiH3 groups or halogen atoms. These compounds may be used as a mixture of two or more types.

In an embodiment, cyclopentasilane (CPS) $Si_5H_{10}$ and/or cyclohexasilane (CHS) $Si_6H_{12}$ may be used as a silane compound. In another embodiment, neopentasilane may be used as a silane compound.

In an embodiment, the silane compound may be first exposed to UV radiation for a predetermined time such that at least part of the cyclosilane compound molecules are transformed into polysilane. A UV exposed silane compound is more viscous and has a boiling point, which is higher than the silane compound that is not exposed to UV. In another embodiment, a substantially pure silane compound (such as CPS or CHS) may be used.

In an embodiment, a substantially pure liquid silane compound or a mixture of at least two substantially pure liquid silane compounds may be used in the formation of a polysilane coating on a substrate. In an embodiment "substantially pure" may refer to a purity level of a liquid semiconducting precursor of 94%, 96%, 98% or higher than 99%.

In an embodiment, the viscosity of the liquid semiconducting precursor may be optimized for use in an ink jet printer. In an embodiment, the viscosity of the liquid semiconducting material may be selected between 1 and 50 mPa·s. In an embodiment, the surface tension may be selected between 10 and 80 dyn/cm, preferably 15 and 70 dyn/cm. The viscosity may be controlled by exposing the liquid semiconducting precursor such as CPS to UV for a predetermined time. During UV exposure the cyclic structure of the CPS molecules breaks so that polysilane chains are formed. The thus formed polysilane is soluble in the CPS.

Alternatively, in another embodiment, a liquid semiconductor precursor comprising dopants may be used. In an embodiment, the semiconductor precursor may comprise one or more doped silane compounds represented by the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

The processing of the silane compounds described in this application (e.g. coating, annealing and/or laser exposure) is performed in an environment with low-oxygen and water levels (well below 0.1 ppm) in order to avoid oxidation of the silane.

While the examples are described with reference to silane compounds, it is submitted that the invention may also be used with germane compounds in order to produce amorphous and/or polycrystalline germanium and/or with a mixture of silane and germane compounds in order to produce amorphous and/or polycrystalline silicon germanium. Particular preference is given to using germanium-hydrogen compounds, i.e. to germanes and oligo- or polygermanes, since they are readily available, have a high germanium content based on the molar mass of the compounds, and due to their physicochemical relationship to the silanes used with preference can be formulated readily therewith.

Numerous examples of suitable germane compounds are described in WO2007/044429A2. Particularly suitable (oligo/poly)germanes for the process according to the invention are those of the general formula $Ge_nH_{2n+2}$ or $Ge_nH_{2n}$ where n=1 to 10, preferably n=4 to 8. When using a mixture of a silane and germane compound semiconducting silicon-germanium layers may be formed wherein the band gap of the semiconducting layer may be controlled by controlling the ratio between the silane and germane compounds.

FIG. 2 depicts an exposure map comprising laser exposure parameters (exposure recipes) that were used in transforming areas of a polysilane coating into solid-state silicon. The exposure map depicts a 8×8 array of areas of a coated substrate, wherein each area of the coating that was exposed to pulsed laser irradiation according to a predetermined exposure recipe. The 5×8 array denoted by 202 comprises areas associated with recipes wherein either the number of pulses and/or the energy density is varied. The square in the upper left corner of the 5×8 array corresponds with a recipe of one pulse (25 ns) of a (relatively low) energy density of 25 mJ/cm2 and the lower right corner of the 8×5 grid corresponds to a recipe of 100 shots of a (relatively high) energy density of 300 mJ/cm2.

The areas in the y-direction are associated with exposure recipes wherein per area the number of pulses (shots) increases in the following fashion: 1, 10, 25, 50, 100. Similarly, the areas in the x-direction are associated with exposure recipes wherein per area energy density increases with steps of 25/50 mJ/cm2 in the following fashion: 25, 50, 75, 100, 150, 200, 250, 300 mJ/cm2. This way, the areas in the 8×5 array cover all recipes comprising combinations of 1-100 shots and 25-300 mJ/cm2.

A problem with conventional excimer laser crystallization is the occurrence of hydrogen effusion. During laser irradiation hydrogen in the amorphous silicon layer may effuse and destroy parts of the silicon layer. When excessive agglomeration of hydrogen occurs the amorphous silicon film may ablate. The effect of ablation and excessive hydrogen effusion may be reduced using a pre-annealing phase comprising one or more low energy density (for example between 10 and 50 mJ/cm2) laser shots in order to decrease the hydrogen content in the amorphous film before exposure of the amorphous silicon to laser irradiation of a higher energy density (for example between 150 and 300 mJ/cm2).

Hence, in order to reduce the effect of hydrogen effusion, some recipes comprise a pre-annealing phase. The recipes associated with areas ME1-Me8 comprises comprising a sequence of laser pulses wherein the number of shots may decrease in a predetermined way. For example, the recipes associated with ME1-ME4 comprise a sequence of pulses wherein the number of shots may decrease in an exponential way and wherein the energy density may start with a low energy density of 25 mJ/cm2. Here ME1-ME19 are associated with the following recipes:

| Recipe | Exposure parameters: |
|---|---|
| ME1 | 100 × 25 mJ/cm2; 50 × 50 mJ/cm2 |
| ME2 | 100 × 25 mJ/cm2; 50 × 50 mJ/cm2; 20 × 75 mJ/cm2; |
| ME3 | 100 × 25 mJ/cm2; 50 × 50 mJ/cm2; 20 × 75 mJ/cm2; 10 × 100 mJ/cm2 |
| ME4 | 100 × 25 mJ/cm2; 50 × 50 mJ/cm2; 20 × 75 mJ/cm2; 10 × 100 mJ/cm2; 1 × 150 mJ/cm2 |
| ME5 | 50 × 25 mJ/cm2; 40 × 50 mJ/cm2 |
| ME6 | 50 × 25 mJ/cm2; 40 × 50 mJ/cm2; 30 × 75 mJ/cm2 |
| ME7 | 50 × 25 mJ/cm2; 40 × 50 mJ/cm2; 30 × 75 mJ/cm2; 20 × 100 mJ/cm2; |
| ME8 | 50 × 25 mJ/cm2; 40 × 50 mJ/cm2; 30 × 75 mJ/cm2; 20 × 100 mJ/cm2; 10 × 150 mJ/cm2 |
| ME9 | 50 × 50 mJ/cm2; 40 × 100 mJ/cm2 |
| ME10 | 50 × 50 mJ/cm2; 40 × 100 mJ/cm2; 30 × 150 mJ/cm2 |
| ME11 | 50 × 50 mJ/cm2; 40 × 100 mJ/cm2; 30 × 150 mJ/cm2; 20 × 200 mJ/cm2 |
| ME12 | 50 × 50 mJ/cm2; 40 × 100 mJ/cm2; 30 × 150 mJ/cm2; 20 × 200 mJ/cm2; 15 × 225 mJ/cm2 |
| ME13 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2 |
| ME14 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 260 mJ/cm2 |
| ME15 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 270 mJ/cm2; |
| ME16 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 280 mJ/cm2; |
| ME17 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 290 mJ/cm2; |
| ME18 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 300 mJ/cm2; |
| ME19 | 50 × 50 mJ/cm2; 40 × 100 mJ/cm2; 30 × 150 mJ/cm2; 20 × 200 mJ/cm2; 15 × 225 mJ/cm2; 10 × 250 mJ/cm2; 1 × 310 mJ/cm2; |

In particular, the recipes ME5-ME8 are associated with exposure recipes wherein an area is exposed to multiple shots in the low energy density regime (i.e. energy densities below 100 mJ/cm2) and one or more shots of a high(er) energy density regime (i.e energy densities higher than 100 mJ/cm2). The multiple low energy density shots may be regarded as a pre-anneal phase wherein the release of hydrogen out of the polysilane film is promoted. The recipes ME9-ME19 are associated with exposure recipes comprising a sequence of pulses wherein the number of shots may be (quasi) linearly decreased in steps between 5 and 10.

Figure 3:
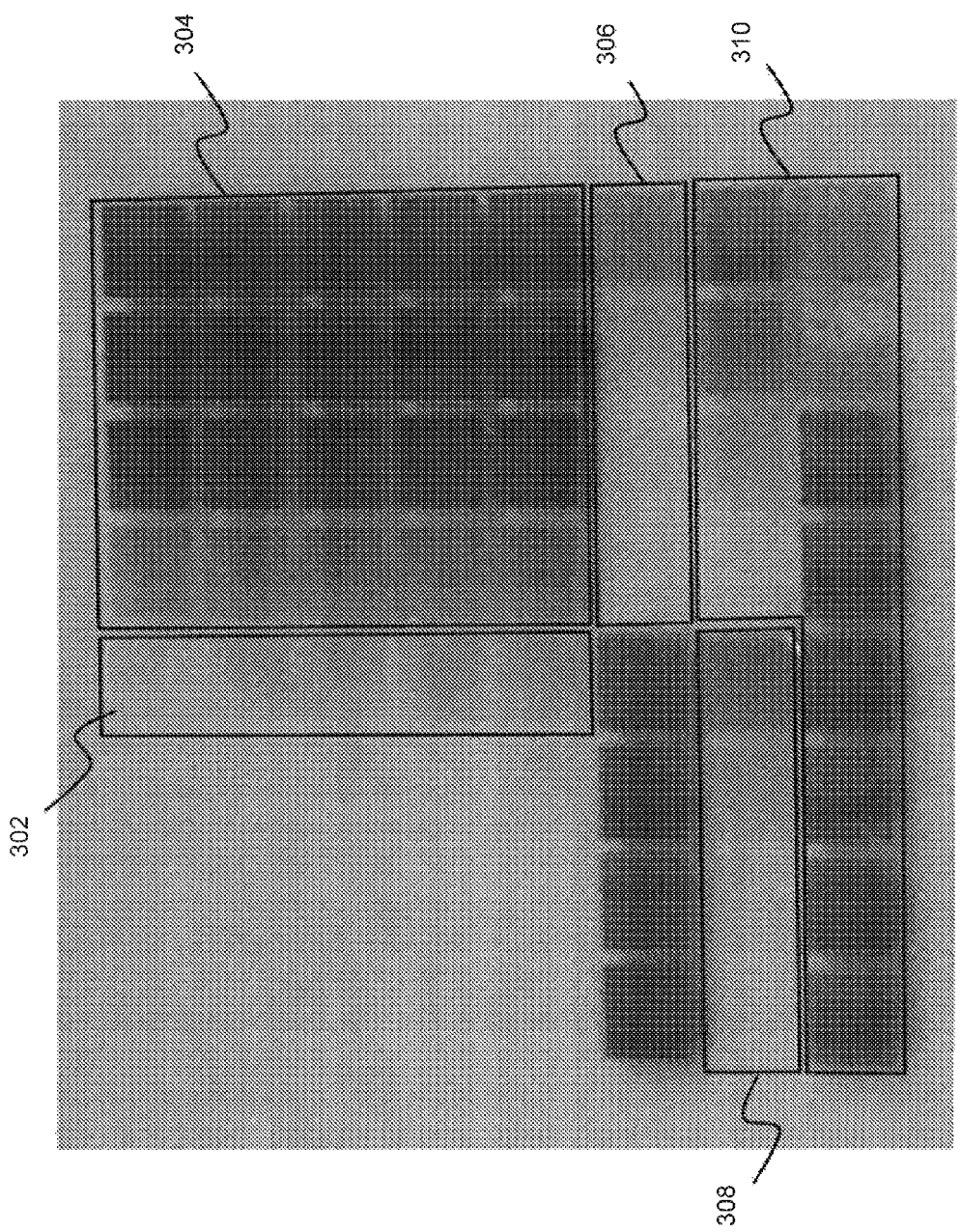
FIG. 3 depicts a polysilane coated glass substrate that has been exposed to different laser radiation exposure recipes.

FIG. 3 depicts a photo associated with a polysilane coated glass substrate, which is annealed at a temperature of 200°

C. In one embodiment, the polysilane coated glass substrate may be prepared as described with reference to FIG. 1. When irradiating the coated substrate in accordance with the exposure recipes as described with reference to FIG. 2, colored square areas may appear for certain recipes indicating the formation of solid-state silicon. When analyzing the composition of the different exposed areas, different exposure recipes 302,304,306,308 may be identified on the basis of Raman spectroscopy, AFM and microscopic inspection (part of these results will be described hereunder in more detail).

For example, for low energy densities in the 8×5 grid 202 of the exposure map (see FIG. 2), the film is barely activated by the irradiation and easily oxidized in air. When the energy density increases up to around 100 mJ/cm2 (i.e. the 4th column 302 in the 8×5 grid), relatively stable amorphous silicon may be formed in the areas exhibiting a yellow/maroon color (not very well visible in the photo of FIG. 3).

Increasing the energy density 100 mJ/cm2 with 50 mJ/cm2 up to around 150 mJ/cm2 may trigger the formation of polysilicon. A thin-film polysilicon layer was formed when exposing the polysilane layer with a single shot of an energy density between 120 and 320 mJ/cm2, preferably between 150 and 300 mJ/cm2 (the four areas of the upper row are formed by using a single shot of 150, 200, 250 and 300 mJ/cm2 energy density respectively). Polysilicon was also formed when using a combination of multiple shot and energy densities up to and including 300 mJ/cm2. These recipes are denoted by 304. Multiple shots at high energy densities (e.g. 100 shots of 300 mJ/cm2) may form a polysilicon film comprising areas in which ablation occurred. The areas in which poly-silicon is formed are visible in the photo of FIG. 3 as relatively dark squares.

The exposure recipe associated with the areas denoted by 306 (i.e. recipes ME1-ME4) and 308 (i.e. recipes ME5-ME8) exhibit the formation of stable amorphous silicon layers if the energy density associated with the final shots is around 100 mJ/cm2 or more. A slight decrease in roughness as compared to the areas without pre-annealing at the same maximum energy density (as described with reference to the recipes denoted by 304) was observed.

The exposure recipes associated with the areas denoted by 310 (i.e. recipes ME9-ME19) all result in thin-films comprising amorphous silicon. Above an energy density of around 150 mJ/cm2, the film may develop multiple sections and multiple results have been obtained (good a-Si and poly-Si). In general, smooth surfaces showed amorphous silicon properties, whereas rougher surfaces show polysilicon properties. Ablation occurs at the last two steps with final energy shots at 300 and 310 mJ/cm2.

Although results of FIG. 3 where obtained by using a pulsed excimer laser, the invention is by no means limited to that example. Other pulse lengths than the used 25 ns pulse lengths may be used. Furthermore, in other embodiment, the light source emitting within a range selected between 100 and 800 nm, preferably between 200 and 400 nm, may be used to expose at least part of the coated substrate. Such light sources may include high- and low-pressure mercury lamps, rare-earth gas discharge lamps, (pulsed) YAG laser, argon lasers and excimer lasers. Exposure to such radiation may transform the polysilane coating into silicon, in particular amorphous silicon or polysilicon (depending on the exposure) or single-crystalline silicon areas when using nano-sized crystallization sites in the substrates (e.g. a hole in the substrate of 100 nm diameter and 500 nm depth). Typical energy densities for transformation into amorphous silicon or polysilicon may be selected from a range between 25 and 1200 mJ/cm$^2$.

FIG. 4A-4D depicts various Raman spectra associated with the formation of amorphous silicon by exposing a polysilane coating to a pulsed laser according to various embodiments of the invention. In this particular example, the coating was annealed at a temperature of 200° C. Each of the spectra shows the broad peak of amorphous silicon of around 320 cm$^{-1}$. FIG. 4A depicts an Raman spectrum associated with an exposure recipe of 50 pulses of 25 mJ/cm2, 40 pulses of 50, 30 pulses of 75, 20 pulses of 100 and 10 pulses of 150 mJ/cm2. FIG. 4B depicts a Raman spectrum associated with an exposure recipe of 25 pulses of 100 mJ/cm2. FIG. 4C depicts an Raman spectrum associated with an exposure recipe of 100 pulses of 25 mJ/cm2, 50 pulses of 50, 20 pulses of 75, 10 pulses of 100 and a single pulse of 150 mJ/cm2. FIG. 4D depicts a Raman spectrum associated with an exposure recipe of 100 pulses of 100 mJ/cm2. These measurements show that high quality amorphous silicon may be formed by exposing a low temperature annealed (200° C. or lower) polysilane coating by pulsed laser irradiation.

FIG. 5A-5D depicts various Raman spectra associated with the formation of polysilicon by exposing a polysilane coating to a pulsed laser according to various embodiments of the invention. In this particular example, the coating was annealed at a temperature of 200° C. Each of the spectra shows the sharp peak of polysilicon at 520 cm$^{-1}$. FIG. 5A depicts a Raman spectrum associated with an exposure recipe of a single pulse of 150 mJ/cm2. FIG. 5B depicts a Raman spectrum associated with an exposure recipe of 100 pulses of 150 mJ/cm2. FIG. 5C depicts a Raman spectrum associated with an exposure recipe of a single pulse of 300 mJ/cm2. FIG. 5D depicts a Raman spectrum associated with an exposure recipe of 100 pulses of 300 mJ/cm2. These measurements show that high quality polysilicon may be formed by exposing a low temperature annealed (200° C. or lower) polysilane coating by pulsed laser irradiation.

Figure 4:
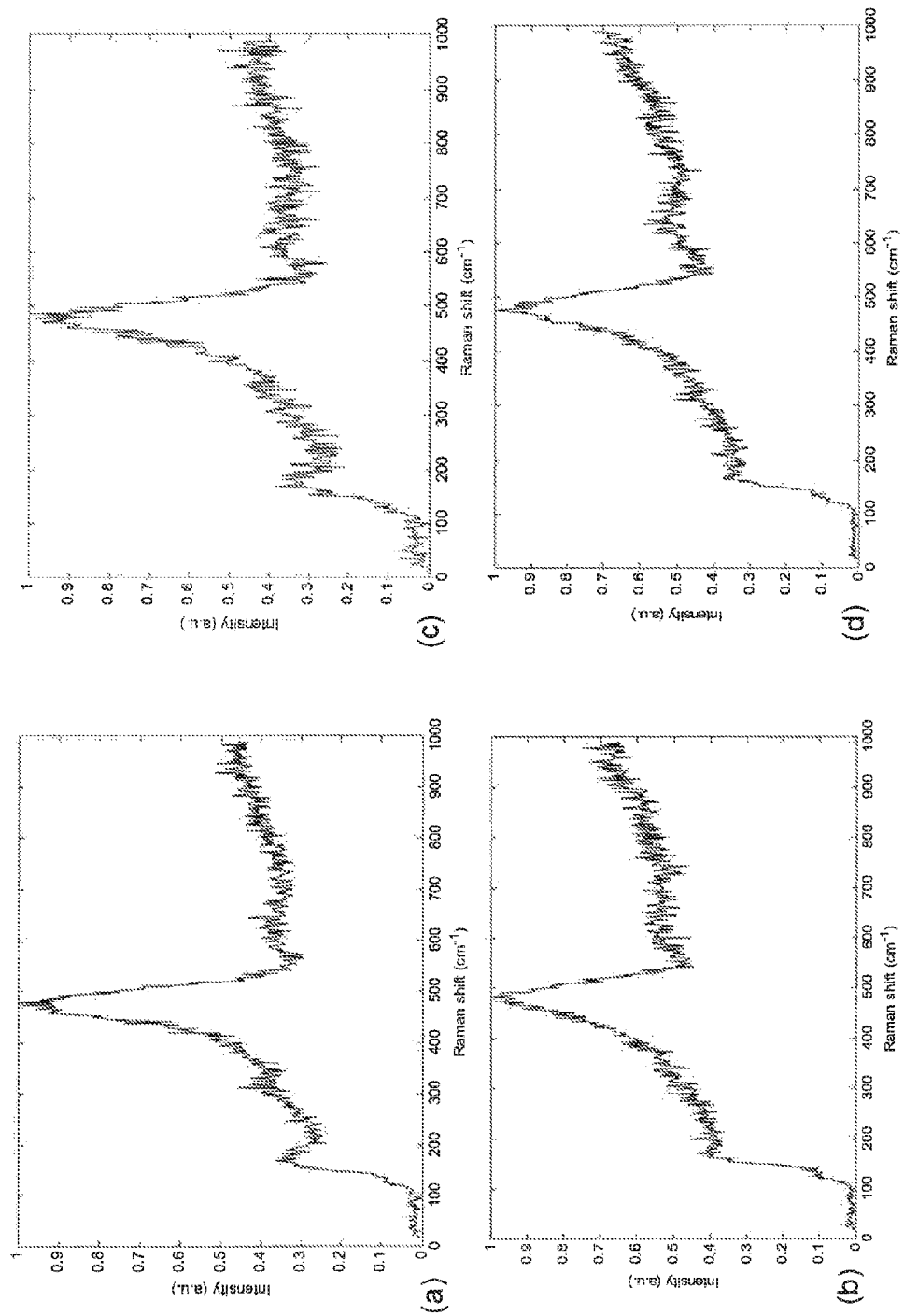
FIG. 4A-4D depict various Raman spectra associated with the formation of amorphous silicon according an embodiment of the invention.
Figure 5:
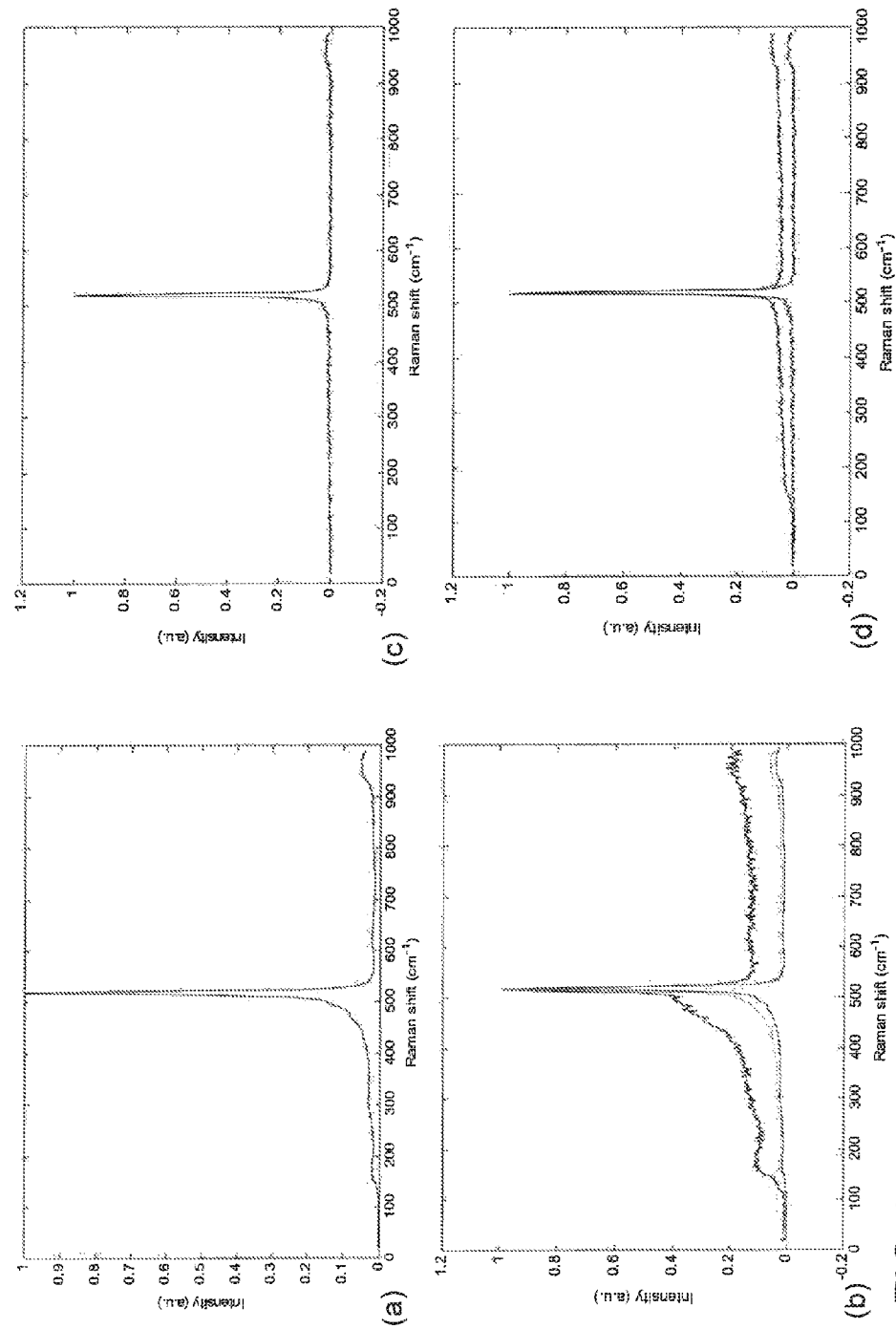
FIG. 5A-5D depict various Raman spectra associated with the formation of polycrystalline silicon according to an embodiment of the invention.

Hence, FIGS. 4 and 5 show that the invention allows transformation of a polysilane coating—an organosilicon compound coating—into a solid-state silicon (e.g. amorphous or polysilicon) by irradiating the coating with light, preferably laser light, of a wavelength selected from a predetermined part of the spectrum. In some embodiments, pulsed laser light selected from a wavelength between 200 and 400 nm may be used. As will be described hereunder in more detail, a very short (25 ns) laser pulse of a predetermined energy density was able to almost instantaneously transform polysilane into polysilicon or amorphous silicon. The process is therefore suitable for crystallization of amorphous films on plastic substrates. Hence, in contrast with prior art processes, the polysilane coating is directly transformed from a molecular-type coating into a polycrystalline silicon coating.

It is emphasized that the silicon formation process according to the invention is substantially different from the prior art liquid silicon formation processes. An temperature annealing step at elevated temperatures (>300° C.) for forming amorphous silicon as required in prior art processes is not required. In addition, de hydrogenation step, which was needed for the prior art, is not required either.

Furthermore, the laser crystallization process according to the invention is not a conventional laser crystallization process, such as the excimer laser crystallization (ELC) process in which an amorphous silicon film is transformed into a polysilicon film. The basic working of the ELC process is the use of a high-power short-wavelength pulsed light source such as an excimer laser that is used to expose the surface of the amorphous silicon. Upon exposure, the top layer of the amorphous silicon absorbs the heat and the a-Si melts almost completely and crystallization occurs when molten silicon cools down. In this invention, because of the low absorption coefficient of polysilane against 308 nm, almost entire thickness absorbs the light and poly-Si or a-Si can be obtained without mediating the melting of silicon.

FIG. 6A-6C depict AFM measurements and a Raman spectrum of a polysilicon thin film that is formed by exposing a polysilane coating to laser irradiation according to an embodiment of the invention. In this particular example, the coating is irradiated with 10 laser pulses of an energy density of 250 mJ/cm2. The associated Raman spectrum shows the formation of high quality polysilicon. The AFM measurements indicate an average grain size of 134 nm and an average roughness of 32 nm.

FIG. 7A-7C depict AFM measurements and a Raman spectrum of a polysilicon thin films that is formed by exposing a polysilane coating to laser irradiation according to an embodiment of the invention. In this particular embodiment, the coating is irradiated with 25 laser pulses of an energy density of 250 mJ/cm2. The associated Raman spectrum shows the formation of high quality polysilicon. The AFM measurements indicate an average grain size of 159 nm and an average roughness of 28 nm.

FIG. 8A-8C depict AFM measurements and a Raman spectrum of a polysilicon thin films that is formed by exposing a polysilane coating to laser irradiation according to an embodiment of the invention. In this particular example, the coating is irradiated with 50 laser pulses of an energy density of 250 mJ/cm2. The associated Raman spectrum shows the formation of high quality polysilicon. The AFM measurements indicate an average grain size of 124 nm and an average roughness of 23 nm.

Figure 6:
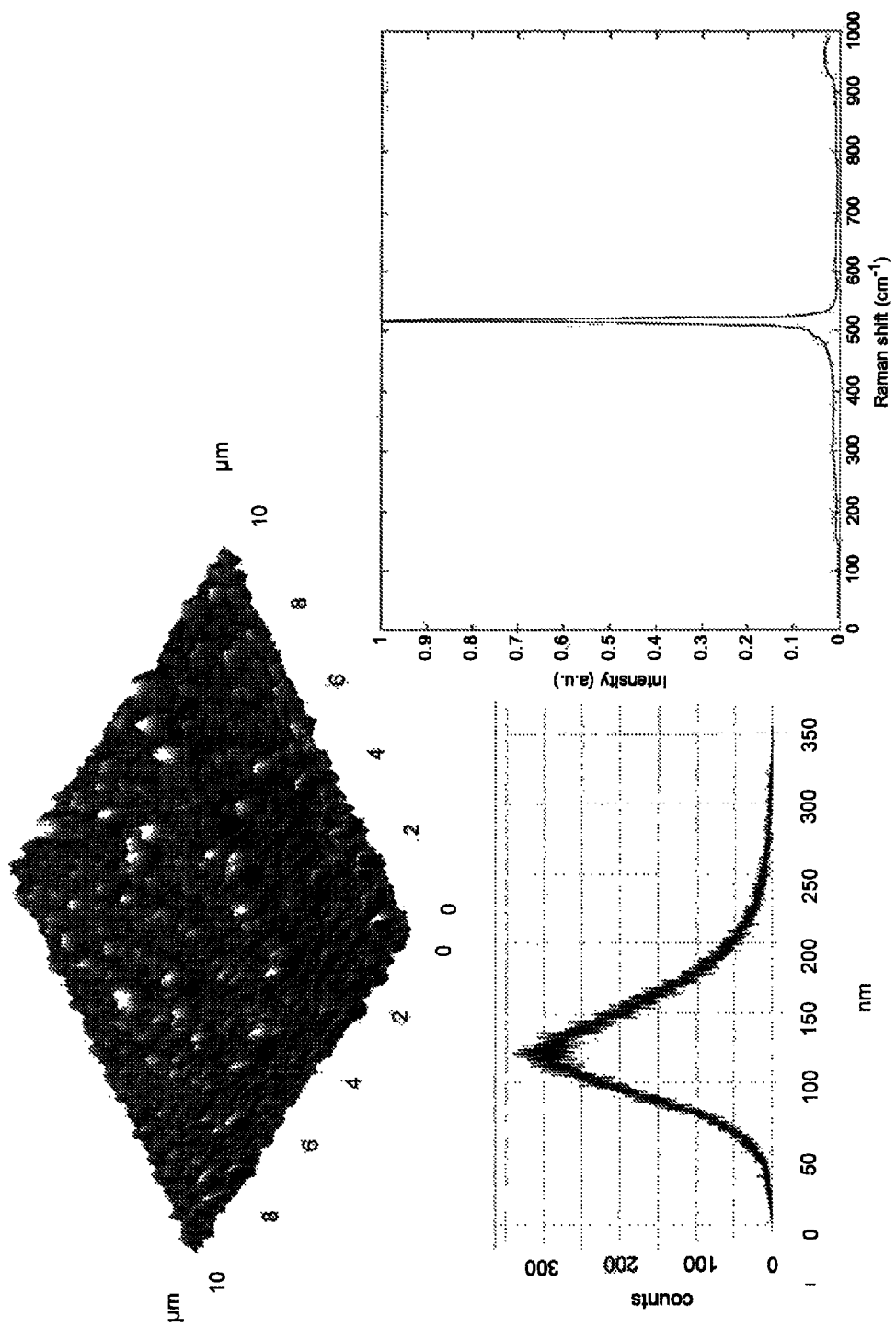
FIG. 6 depicts an AFM picture and a Raman spectrum associated with the formation of a polycrystalline silicon layer according to an embodiment of the invention.
Figure 7:
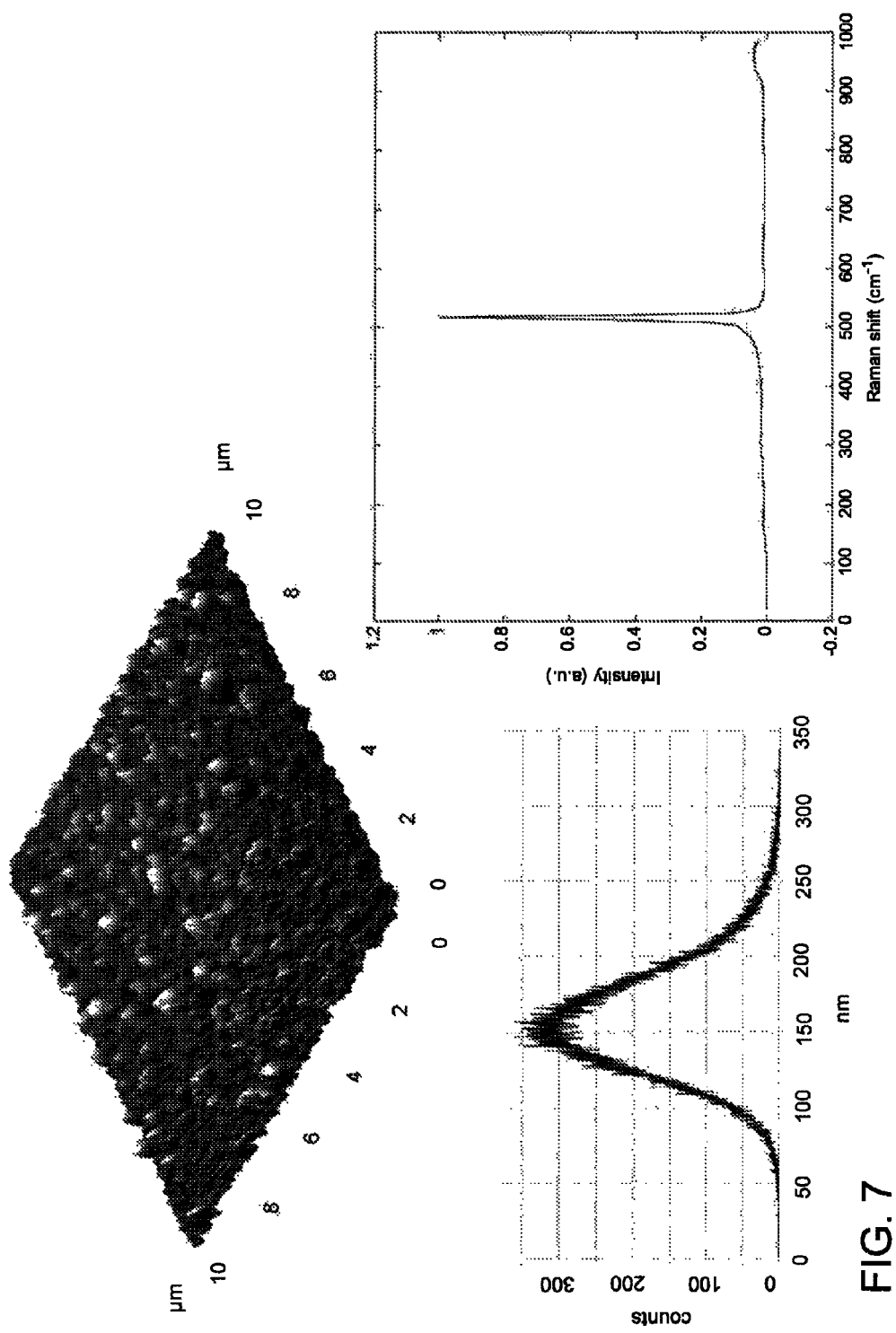
FIG. 7 depicts an AFM picture and a Raman spectrum associated with the formation of a polycrystalline silicon layer according to another embodiment of the invention.
Figure 8:
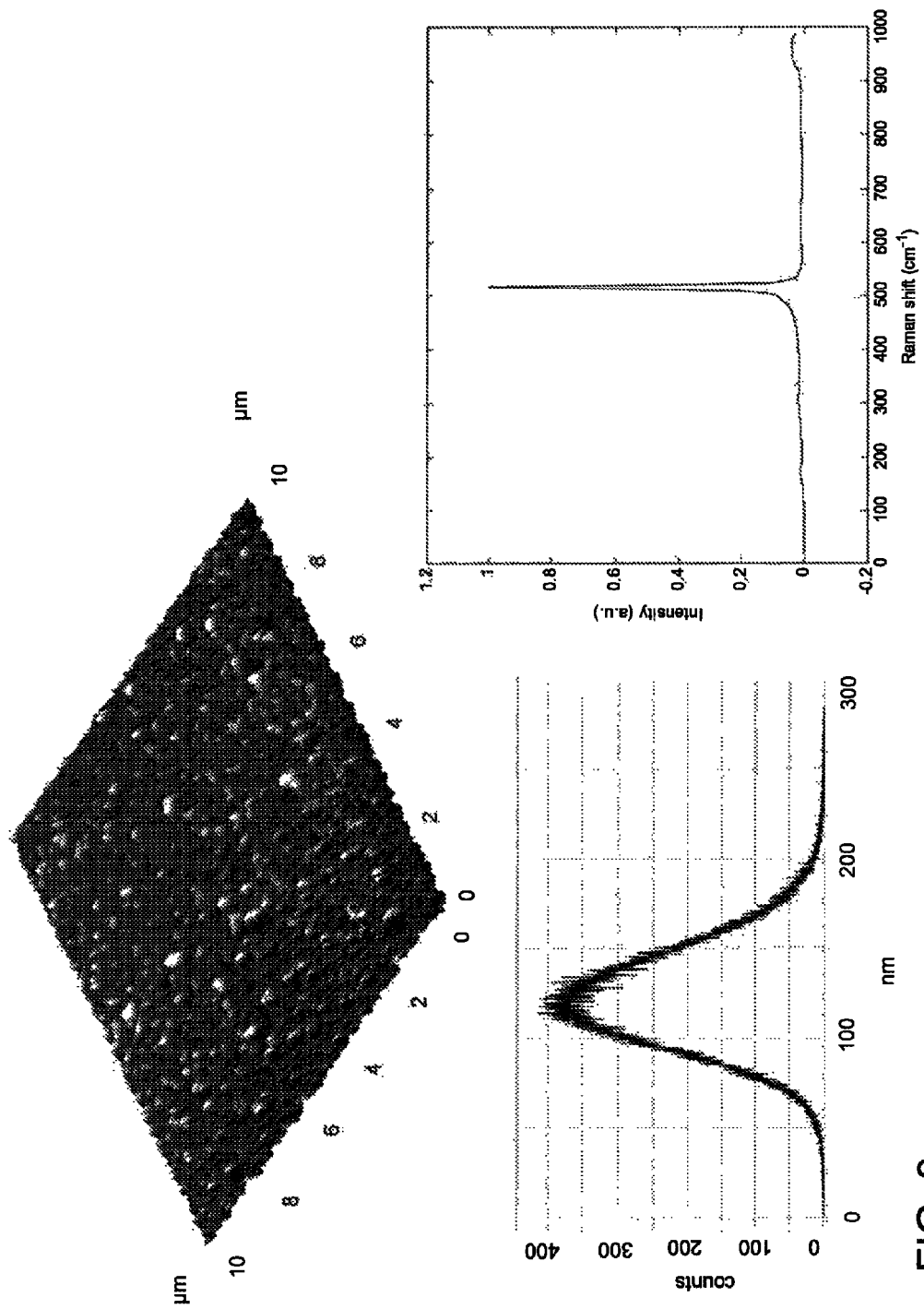
FIG. 8 depicts an AFM picture and an Raman spectrum associated with the formation of a polycrystalline silicon layer according to yet another embodiment of the invention.

Hence, on the basis of FIG. 6-8 it follows that high quality polysilicon thin-films may be formed by irradiating a polysilane coated substrate with pulsed laser light. The grain size of the polysilicon may vary between 100 and 150 nm for a number of pulses with an energy density of 250 mJ/cm2.

FIG. 9A-9C depict AFM measurements and a Raman spectrum of a polysilicon thin films that is formed by exposing a polysilane coating to laser irradiation according to an embodiment of the invention. In this particular example, the coating is irradiated with 10 laser pulses of an energy density of 300 mJ/cm2. The associated Raman spectrum shows the formation of high quality polysilicon. The AFM measurements indicate an average grain size of 280 nm and an average roughness of 105 nm.

FIG. 10A-10C depict AFM measurements and a Raman spectrum of a polysilicon thin films that is formed by exposing a polysilane coating to laser irradiation according to an embodiment of the invention. In this particular example, the coating is irradiated with 25 laser pulses of an energy density of 300 mJ/cm2. The associated Raman spectrum shows the formation of high quality polysilicon. The AFM measurements indicate an average grain size of 254 nm and an average roughness of 94 nm.

FIG. 11A-11C depict AFM measurements and a Raman spectrum of a polysilicon thin films that is formed by exposing a polysilane coating to laser irradiation according to an embodiment of the invention. In this particular example, the coating is irradiated with 50 laser pulses of an energy density of 300 mJ/cm2. The associated Raman spectrum shows the formation of high quality polysilicon. The AFM measurements indicate an average grain size of 234 nm and an average roughness of 76 nm.

Figure 9:
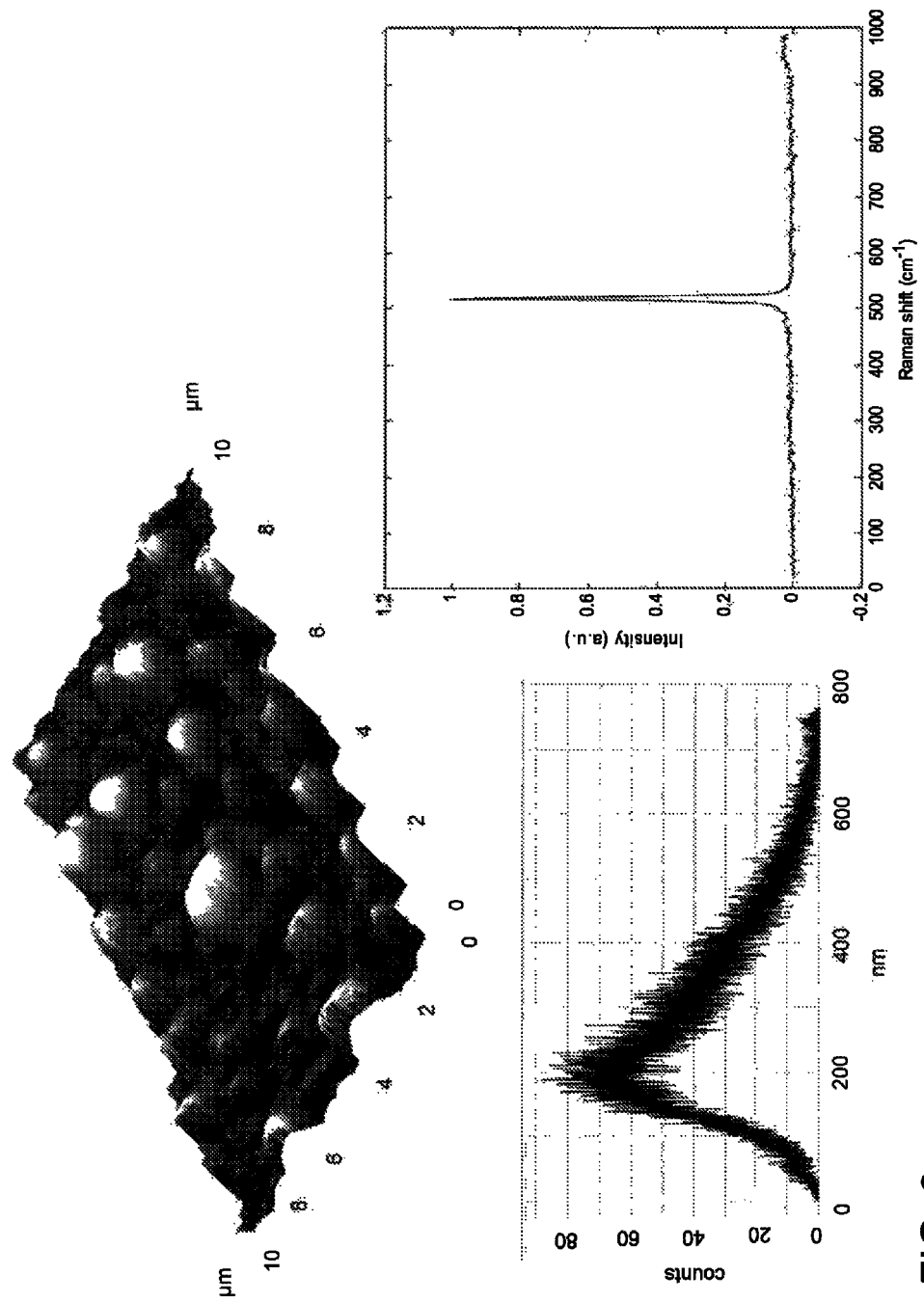
FIG. 9 depicts an AFM picture and a Raman spectrum associated with the formation of a polycrystalline silicon layer according to further embodiment of the invention.
Figure 10:
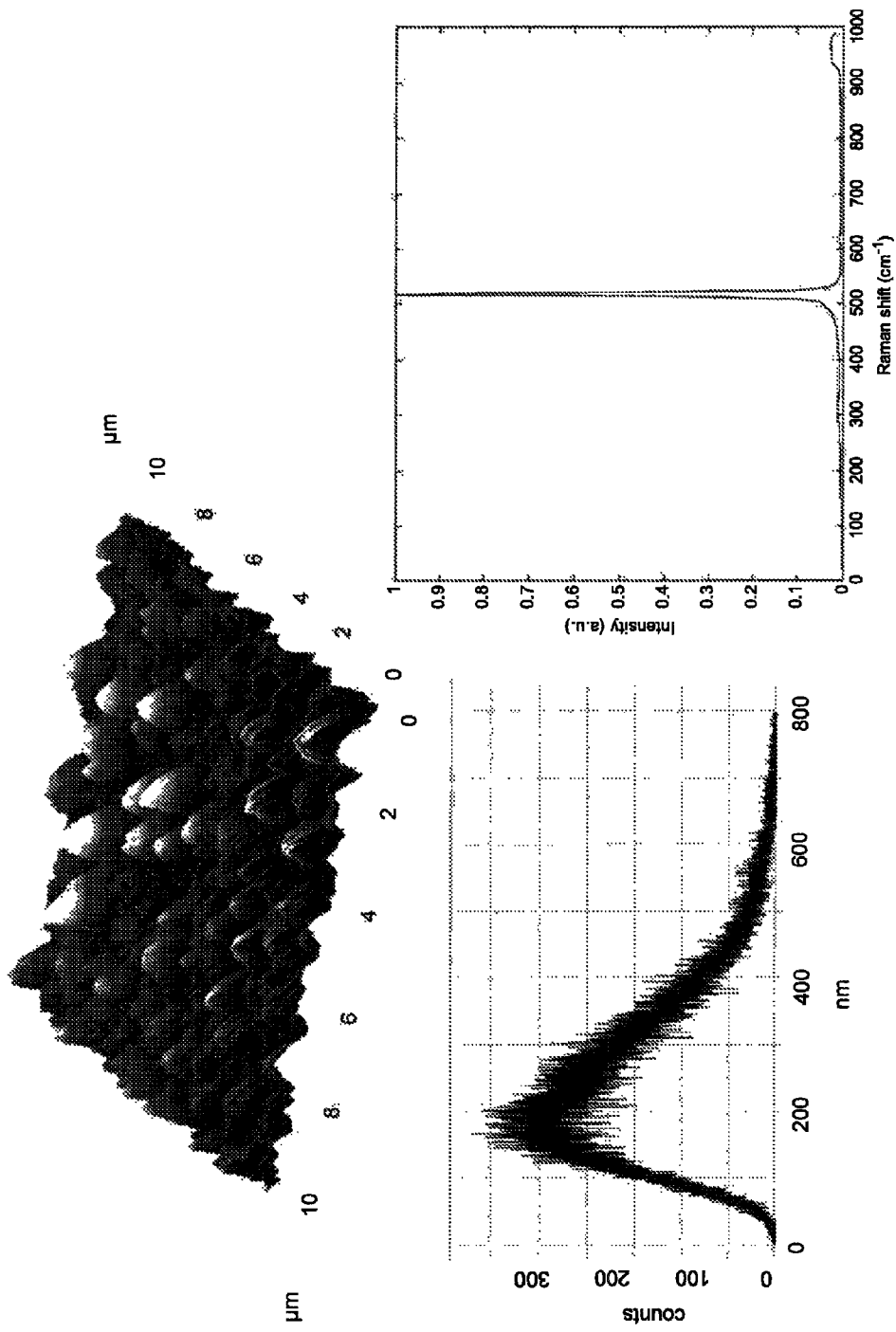
FIG. 10 depicts an AFM picture and a Raman spectrum associated with the formation of a polycrystalline silicon layer according to yet a further embodiment of the invention.
Figure 11:
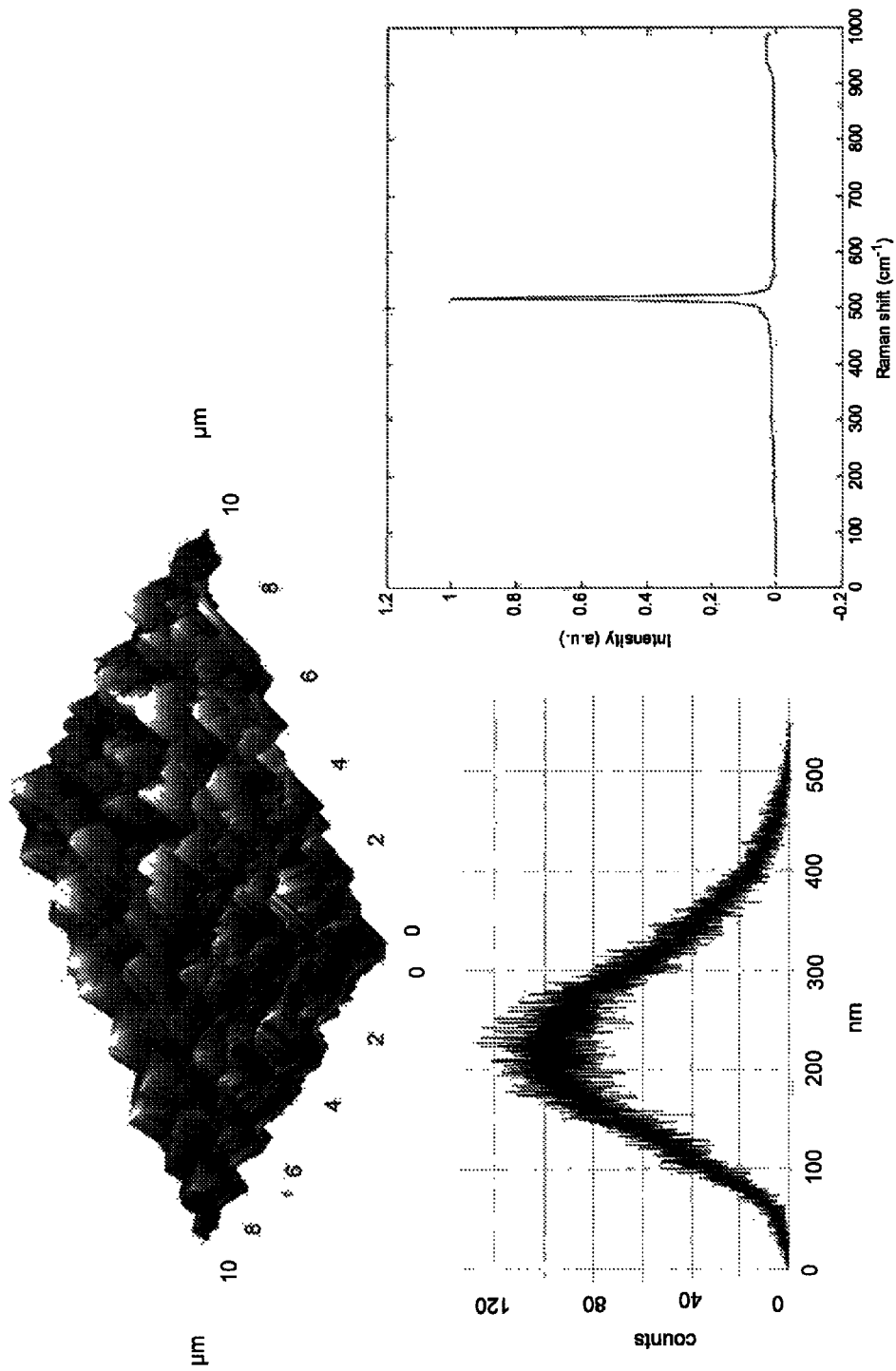
FIG. 11 depicts an AFM picture and a Raman spectrum associated with the formation of a polycrystalline silicon layer according to yet an embodiment of the invention.

Hence, on the basis of FIG. 9-11 it follows that high quality polysilicon thin-films may be formed by irradiating a polysilane coated substrate with pulsed laser light. The grain size of the polysilicon thin-films may be between 5 and 250 nm.

Figure 12:
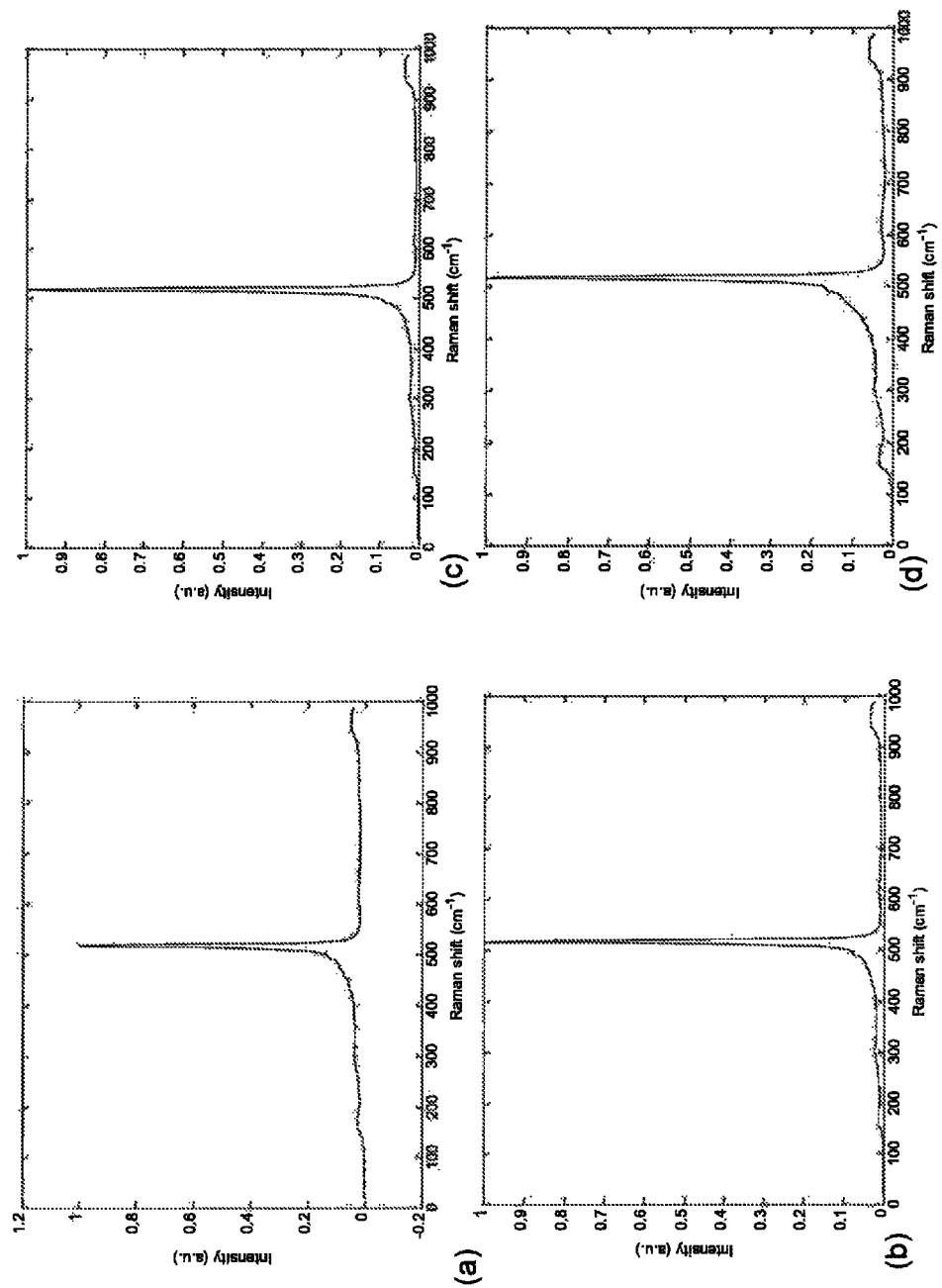
FIG. 12A-12D depict various Raman spectra associated with the formation of polycrystalline silicon according to an embodiment of the invention.

FIG. 12A-12D depicts various Raman spectra associated with the formation of polysilicon by exposing a polysilane coating to laser irradiation according to an embodiment of the invention. In this particular example, the coating was prepared in a similar way as described with reference to FIG. 1 wherein in this case the annealing temperature is about 150° C. Each of the spectra shows the sharp peak of polysilicon at 520 cm$^{-1}$. Here, FIG. 12A depicts a Raman spectrum associated with one pulse of around 150 mJ/cm2 energy density. FIG. 12B depicts a Raman spectrum associated with 50 pulses of around 50 mJ/cm2 energy density. FIG. 12C depicts a Raman spectrum associated with one pulse of an energy density of around 300 mJ/cm2. FIG. 12D depicts a Raman spectrum associated with 100 pulses of an energy density of around 150 mJ/cm2. These measurements show that also when annealing the coating at relatively low annealing temperatures, e.g. temperatures of around 150 and low, polycrystalline thin-films may be formed by irradiating the annealed coated substrates.

Figure 13:
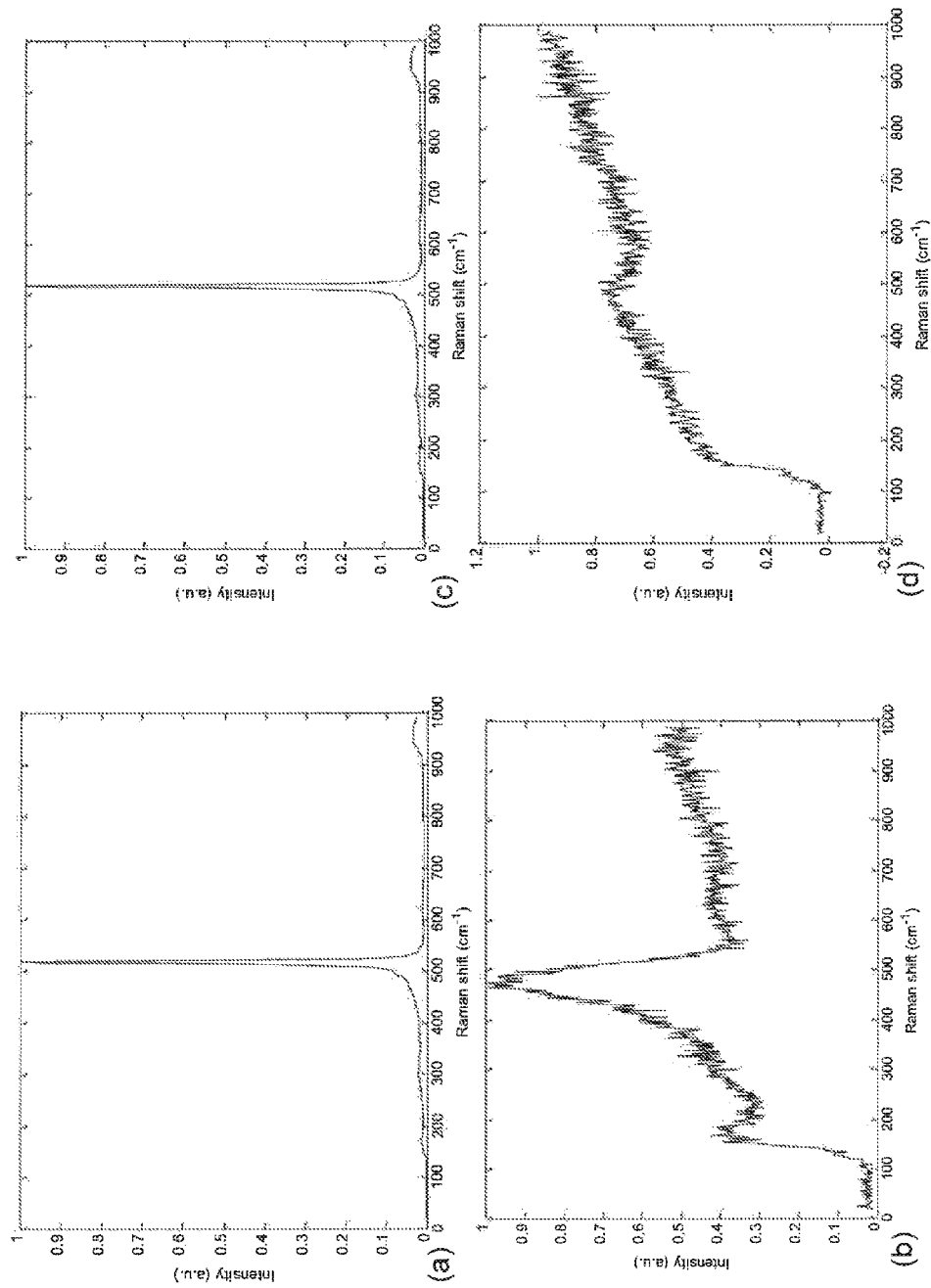
FIG. 13A-13D depict various Raman spectra associated with the formation of amorphous silicon according to an embodiment of the invention.

FIG. 13A-13D depicts various Raman spectra associated with the formation of polysilicon by exposing a polysilane coating to a pulsed laser. In this particular example, the coating was prepared in a similar way as described with reference to FIG. 1 wherein in this case the annealing temperature is about 150° C. Each of the spectra shows the sharp peak of polysilicon at 520 cm$^{-1}$. Here, FIG. 13A depicts a Raman spectrum associated with 100 pulses of 25 mJ/cm2 and 10 pulses of 100 mJ/cm2 energy density. FIG. 13B depicts a Raman spectrum associated with 100 pulses of around 12 mJ/cm2 energy density and 50 pulses of 50 mJ/cm2. In this particular case amorphous silicon is formed. FIG. 13C depicts a Raman spectrum associated with 50 pulses of 25 mJ/cm2 and 20 pulses of 100 mJ/cm2. FIG. 13D depicts a Raman spectrum of an area that is not exposed to laser radiation. These measurements show that also when annealing the substrate with the coating at relatively low annealing temperatures, e.g. temperatures of around 150° C. and lower, polycrystalline and amorphous thin-films may be formed by irradiating the coated substrates.

The above process may be used in a low temperature process for forming a thin-film silicon layer, e.g. an amorphous layer, microcrystalline or a polysilicon layer, on a substrate by simply exposing a polysilane coating to laser irradiation, preferably pulsed laser irradiation. Hence, instead of forming an amorphous silicon layer by a thermal anneal, a polysilane coating may be exposed on the basis of a certain exposure recipe in order to form either amorphous or polycrystalline silicon. Moreover, a low-temperature (i.e. around 200° C. and lower, preferably 150° C. and lower) single shot laser crystallization process may be achieved. Such method is the basis for the fabrication of TFTs and solar cells on flexible substrates. Hereunder, some applications of the above-described low-temperature thin-film manufacturer process are described in more detail.

FIGS. 14A-14D and 15A-15D depict various Raman spectra associated with the formation of silicon layer (polysilicon or a mixture of an amorphous and polycrystalline silicon) by exposing a polysilane coating to a laser pulse of a predetermined energy density. The coating was prepared in a similar way as described with reference to FIG. 1 wherein not temperature anneal was used. The spectra show a sharp peak of polysilicon at 520 cm$^{-1}$.

Figure 14:
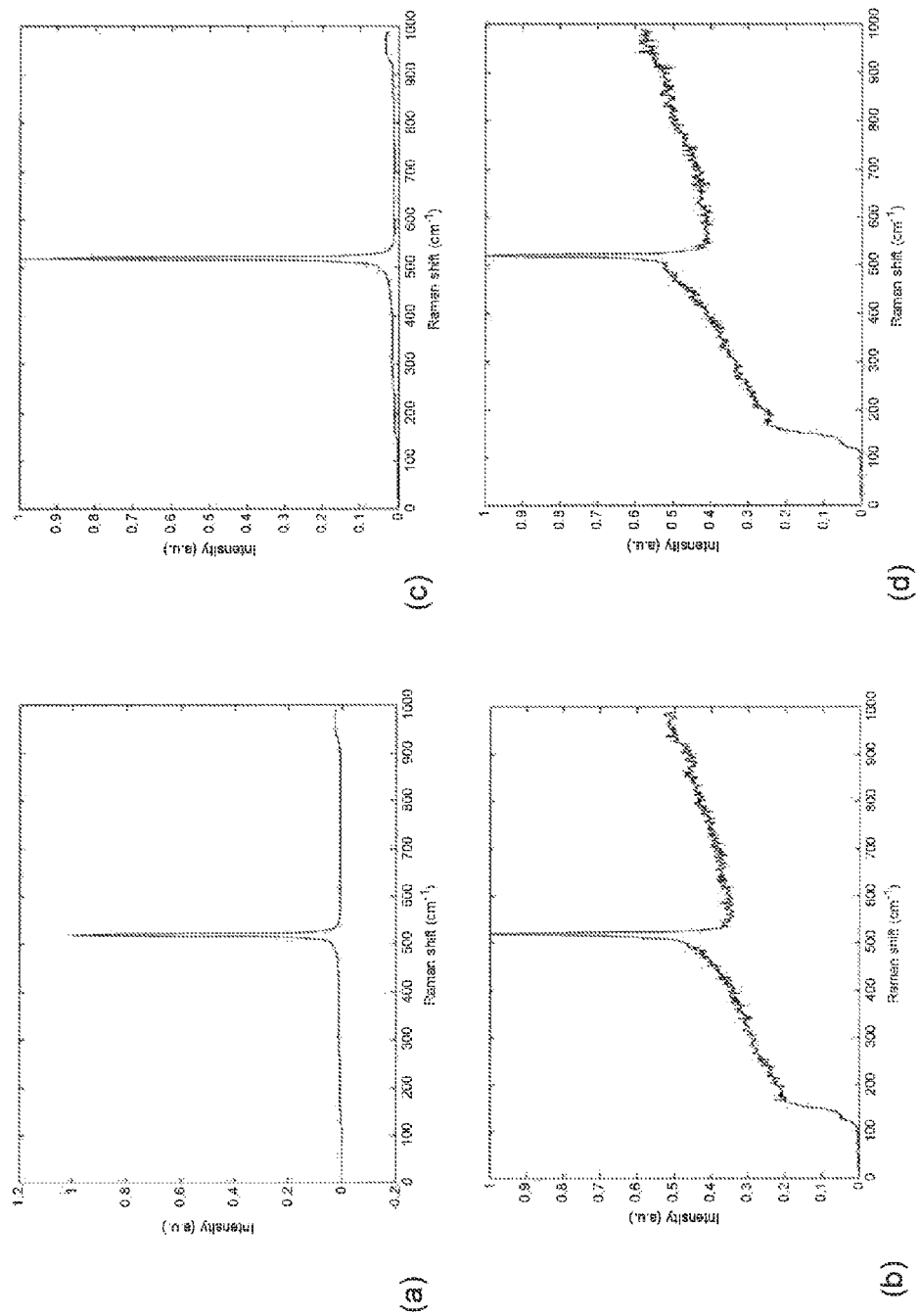
FIG. 14A-14D depict various Raman spectra associated with the formation of amorphous silicon according to an embodiment of the invention.

Here, FIGS. 14A and 14B depict a Raman spectrum associated with 1 pulse of 75 mJ/cm2. The spectra are associated with different parts of the exposed area. The polysilicon spectrum in FIG. 14A indicates that in some parts of the exposed area polysilicon is formed. The spectrum in FIG. 14B both show a polysilicon peak at 520 cm$^{-1}$ and the characteristic peak at 489 cm$^{-1}$ of amorphous silicon indicating this area both comprises amorphous and polysilicon. Similar results are obtained for the exposure of the polysilane coating to one pulse of an energy density of 100 mJ/cm2 as depicted in FIGS. 15C and 15D.

Figure 15:
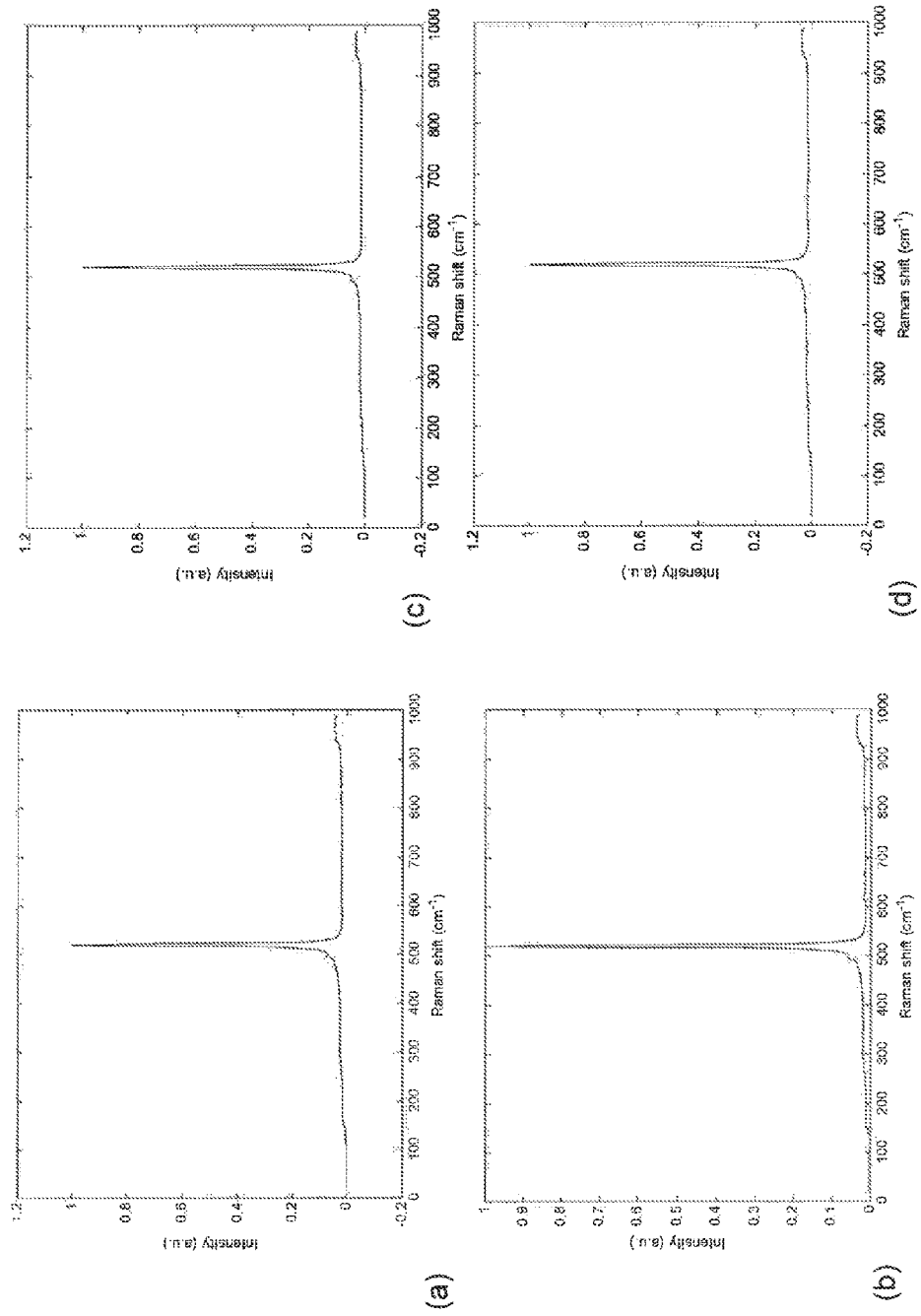
FIG. 15A-15D depict various Raman spectra associated with the formation of amorphous silicon according to an embodiment of the invention.

FIG. 15A-15D show single shot laser exposures of the polysilane coating for increasing energy densities: FIG. 15A shows the result of the exposure of the polysilane coating using a single shot laser pulse of 150 mJ/cm2; FIG. 15B shows the result of the exposure of the polysilane coating using a single shot laser pulse of 200 mJ/cm2; FIG. 15C shows the result of the exposure of the polysilane coating using a single shot laser pulse of 250 mJ/cm2 and FIG. 15D shows the result of the exposure of the polysilane coating using a single shot laser pulse of 300 mJ/cm2. These results show that polycrystalline layers are obtained by exposing a polysilane coating with pulsed laser light of an energy density selected between 150 and 300 mJ/cm2 wherein the polysilane coating was not subjected to a temperature annealing step before the laser exposure.

Figure 16:
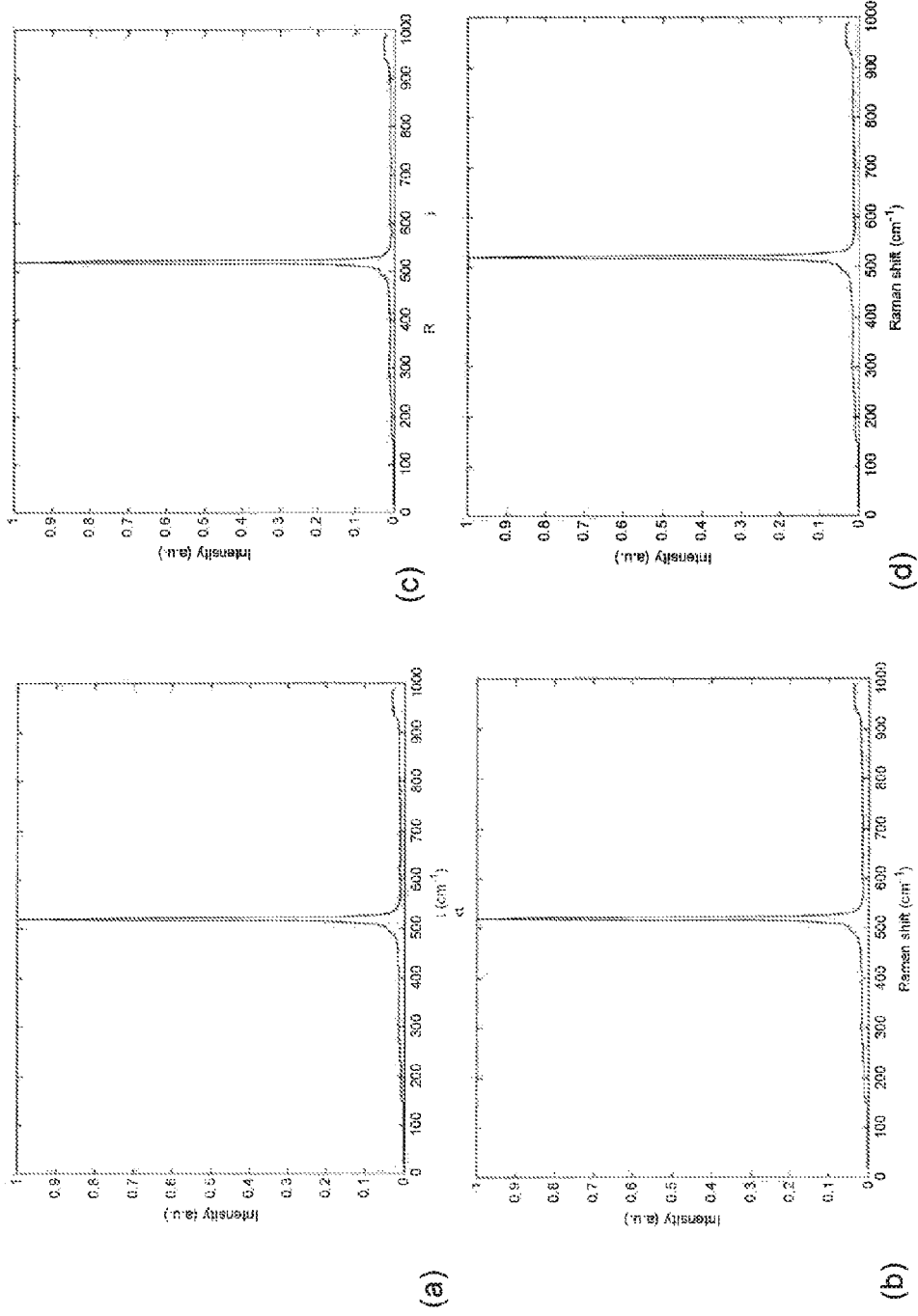
FIG. 16A-16D depict various Raman spectra associated with the formation of amorphous silicon according to an embodiment of the invention.

FIG. 16A-16D depict various Raman spectra associated with the formation of a silicon by exposing a relatively thick polysilane layer with a pulsed laser using different energy densities. The coating was prepared in a similar way as described with reference to FIG. 1 wherein no temperature anneal was used. The thickness of the coating is about two micron. In particular, FIG. 16A-16D show the results of single shot laser exposures of the polysilane coating for increasing energy densities: FIG. 16A shows the result of the exposure of the polysilane coating using a single shot laser pulse of 75 mJ/cm2; FIG. 16B shows the result of the exposure of the polysilane coating using a single shot laser pulse of 100 mJ/cm2; FIG. 16 C shows the result of the exposure of the polysilane coating using a single shot laser pulse of 100 mJ/cm2 and FIG. 15D shows the result of the exposure of the polysilane coating using a single shot laser pulse 300 mJ/cm2. These results show that polycrystalline layers are obtained by exposing a polysilane coating with pulsed laser light of an energy density selected between 75 and 300 mJ/cm2 wherein the polysilane coating was not subjected to a temperature annealing step before the laser exposure.

FIG. 17A-17D depict various Raman spectra associated with the formation of a silicon by exposing a relatively thick polysilane layer with a pulsed laser using different energy densities and number of shots. The coating was prepared in a similar way as described with reference to FIG. 1 wherein no temperature anneal was used. The thickness of the coating is about two micron. In particular, FIG. 16A-16D show the spectra for single shot laser exposures of the polysilane coating for increasing energy densities: FIG. 16A shows the result of the exposure of the polysilane coating using a single shot laser pulse of 75 mJ/cm2; FIG. 16B shows the result of the exposure of the polysilane coating using a single shot laser pulse of 100 mJ/cm2; FIG. 16 C shows the result of the exposure of the polysilane coating using a single shot laser pulse of 100 mJ/cm2 and FIG. 16D shows the result of the exposure of the polysilane coating using a single shot laser pulse 300 mJ/cm2.

Figure 17:
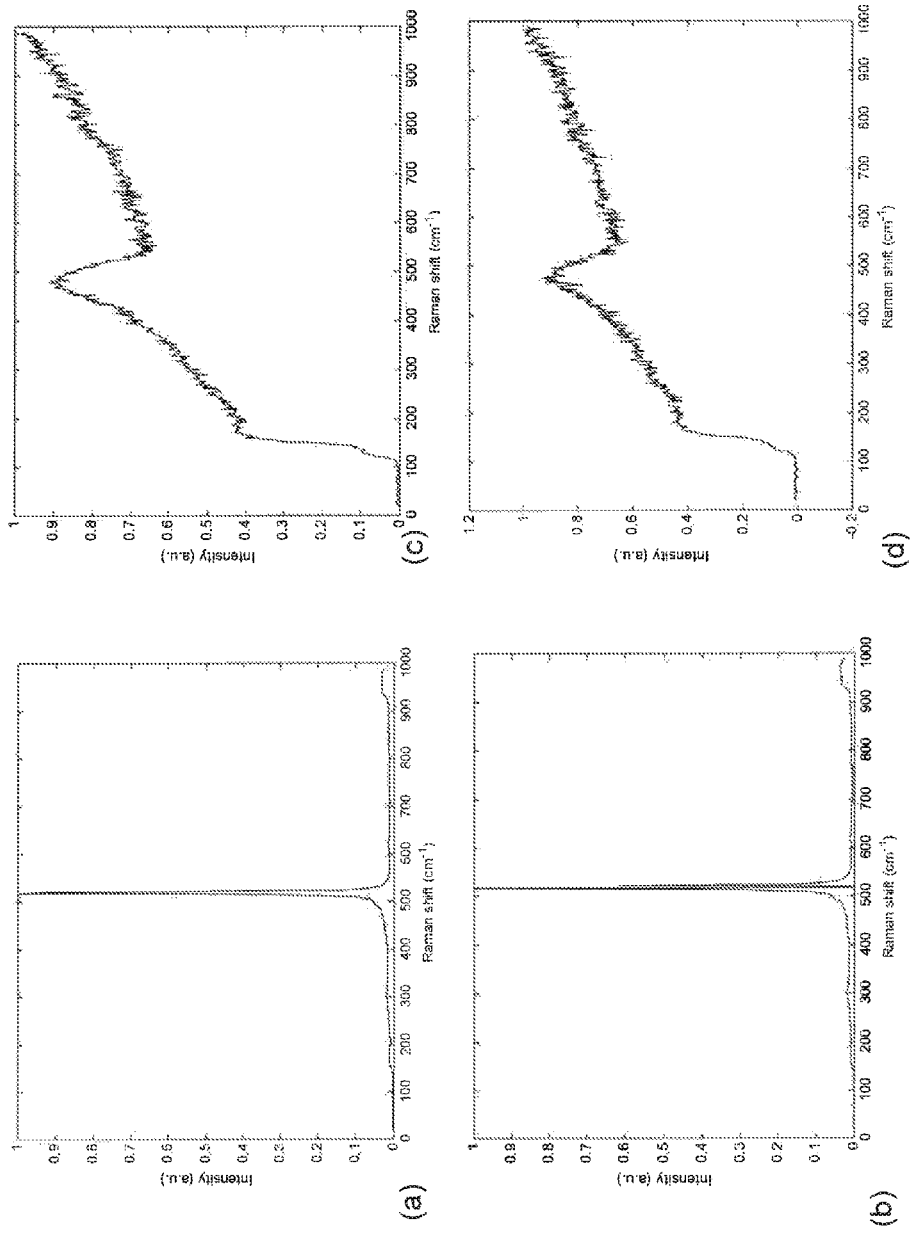
FIG. 17A-17D depict various Raman spectra associated with the formation of amorphous silicon according to an embodiment of the invention.

FIG. 17A-17D depict various Raman spectra associated with the formation of a silicon by exposing a polysilane layer that is similar to the one described with reference to FIG. 16A-16D. In particular, FIG. 17A-17D show the spectra for laser exposure wherein the number of shots and/or the energy density was varied: FIG. 17A shows the result for exposing the polysilane coating with 100 pulses of 100 mJ/cm2; FIG. 17B shows the result for exposing the polysilane coating with 100 pulses of 300 mJ/cm2; FIG. 17 C shows the result of the exposure of the polysilane coating using a recipe ME 7 (i.e. 50 pulses of 25; 40 pulses of 50; 30 pulses of 75 and 20 pulses of 100 mJ/cm2) as described with reference to the exposure map of FIG. 2 and FIG. 17D shows the result of the exposure of the polysilane coating using a recipe ME 4 (i.e. 100 pulses of 25; 50 pulses of 50; 20 pulses of 75; 10 pulses of 100; and one pulse of 150 mJ/cm2).

As shown in FIGS. 16A-16D and FIGS. 17A and 17B a thick around 2 micron thick polycrystalline silicon layer was obtained by exposing a thick layer of polysilane to pulsed laser light. In more general, for exposure recipes in box 202 of FIG. 2 around 75 mJ/cm2 and above (up to 300 mJ/cm2) polycrystalline layers were obtained. For the recipes ME2-ME8 the formation of amorphous silicon was observed (as e.g. shown in FIGS. 17C and 17D. Exposure of the polysilane layers on the basis of recipes M9-M19 resulted again in polycrystalline layers.

The results in FIGS. 16 and 17 show that the invention may also be applied to thick polysilane layers. Thick polysilane layers may be obtained by repetitive coating of polysilane layers on a substrate. Then, once a desired thickness is obtained, the polysilane layer may be exposed to laser light using an appropriate exposure recipe. The formation of thick polysilicon layers is important in the formation of silicon photovoltaic devices.

Figure 18:
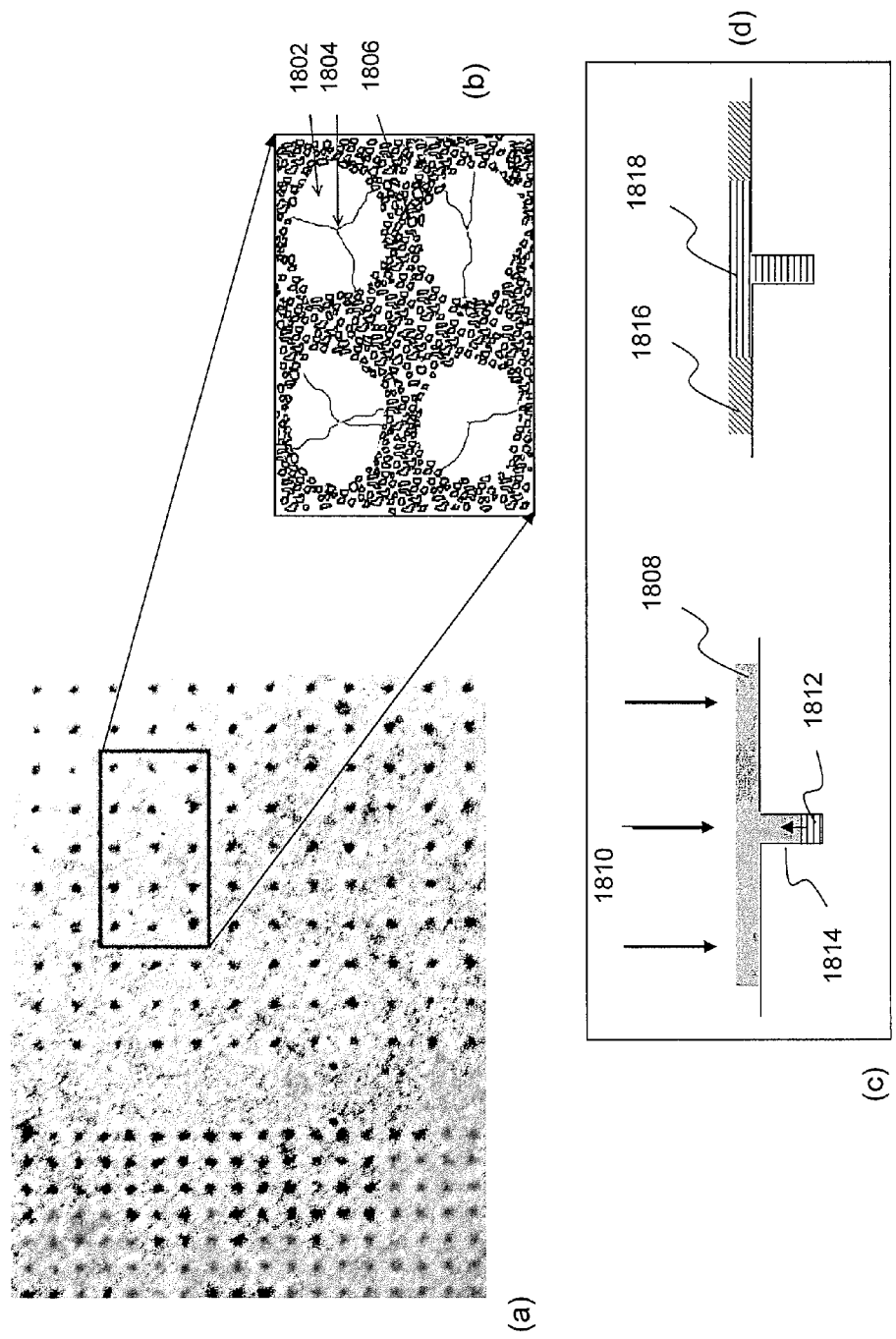
FIG. 18A-18D depict the formation of single-crystalline grains according to an embodiment of the invention.

FIG. 18A-18D schematically depicts the formation of single-crystalline grains according to an embodiment of the invention. In this particular case, the before the substrate was coated with polysilane, submicron holes comprising a diameter between 300 and 100 nm and a depth between 400 and 1000 nm may be fabricated in the substrate using standard lithography or a (nano) imprint technique. Thereafter, the substrate comprising the nanoholes was coated with a polysilane layer and exposed to laser light according to a predetermined recipe (in this case: 100 shots of 150 mJ/cm2) without any thermal anneal. After exposure a silicon film was formed as shown in the image of FIG. 1A. A close-up around the nanoholes shows that the around the nanoholes a single-crystalline silicon grain was formed as schematically depicted in FIG. 18B. In particular, around a nanohole, a single-crystalline silicon grain 1802 was formed of around 1-2 micron in diameter. At further distances, the granular structure of polycrystalline silicon 1806 was observed. The use of these nanoholes as a "grain-filter" in order to form a single-crystalline grain is well known. In the prior art however the single-crystalline grains were formed by laser-annealing amorphous silicon that was formed in the grain filter using a thermal anneal around 350 C. In the process of FIG. 18A-18C such thermal anneal is not necessary. The nanohole may be filled with polysiliane and directly exposed to a pulsed laser in order to transform the polysilane directly into a single crystalline grain. FIG. 18C, schematically depicts the laser anneal of the polysilane 1808 in the nanohole. When exposing the polysilicon to the laser radiation 1810, the formation of single crystalline silicon 1812 may start in the nanohole and follow the nanohole up until it reaches the horizontal plane of the substrate. There, the growth of the single crystalline grain will continue for a while until the formation of polycrystalline silicon takes over. FIG. 18D shows an example of the resulting structure having a single crystalline silicon 1818 grain around the grain filters and polycrystalline silicon 1816 away from the grain filters. Hence, this process shows that the invention not only allows low temperature formation of amorphous and polycrystalline silicon on the basis of a liquid silane precursor (e.g. CPS and/or a polysilane).

FIG. 19A and FIG. 19B schematically depict to variants of a so-called roll-to-roll processes for the manufacturing of silicon structures with small feature size on a flexible (plastic) substrate. In a first step, a template 1902 may be used to imprint certain patterns 1904 (trenches or recesses) in the (flexible) substrate 1905. Then, a doctor blade 1906 may be used to remove excess CPS 1908 from the substrate so that only the recesses are filled with CPS 1910. Thereafter, the CPS in the recess may be exposed to a short UV exposure in order to stimulate the formation of polysilane. Thereafter, a low-temperature anneal, i.e. around 200° C. or lower, may be used to further cross-link the polysilane. Thereafter, the UV irradiated CPS may be exposed to pulsed laser light in order to form a thin-film of solid-state silicon, i.e. amorphous silicon or polysilicon silicon. This way, a simple and efficient R2R compatible manufacturing process may be realized.

FIG. 19B depicts a variant of FIG. 19A wherein instead of using a doctor blade technique in order to file the imprinted recesses, an ink jet printing technique may be used wherein an ink head 1905 is placed above the imprinted area so that when starting ink jet printing, one or more ink droplet 1907 will fill the recess.

FIG. 20A schematically depicts a manufacturing process according to an embodiment of the invention. The process allows the formation of a thick, multilayer stack of silicon thin-films. In particular, the first process step of FIG. 20A depicts the formation of a polysilane layer 2004 wherein CPS may be coated on a substrate using a suitable coating technique, e.g. a doctor blade technique 2002 and wherein the coated CPS is exposed to UV for a predetermined time (not shown). The doctor blade may be used to remove excessive CPS 2003.

Then in a second process step, the polysilane layer may be rapidly transformed into a polycrystalline or an amorphous thin-film layer 2008 using a one shot (or multiple shot) laser exposure 2006 of a predetermined energy density. These process steps may be repeated in order to form one or more further layers 2016 (e.g. a silicon layer) over the first silicon layer. As the process allows single shot formation of a polycrystalline layer, multilayer structures may be easily realized.

In FIG. 20B schematically depicts a manufacturing process according to an embodiment of the invention. The process allows the formation of a thick, silicon thin-film. In particular, the first process step of FIG. 20A depicts the formation of a first polysilane layer 2012 wherein CPS may be coated on a substrate using a suitable coating technique, e.g. a doctor blade technique 2002 and wherein the coated CPS is exposed to UV for a predetermined time (not shown). One or more further polysilane layers 2013 may be formed over the first polysilane layer by repeating the coating process. This way a thick polysilane multilayer may be formed. The thick polysilane multilayer 2016 may be irradiated using a pulsed laser 2014 and transformed into an amorphous or polycrystalline semiconducting layer of thickness in a range of between 2 and 20 micron.

Figures 21A, 21B, 21C:
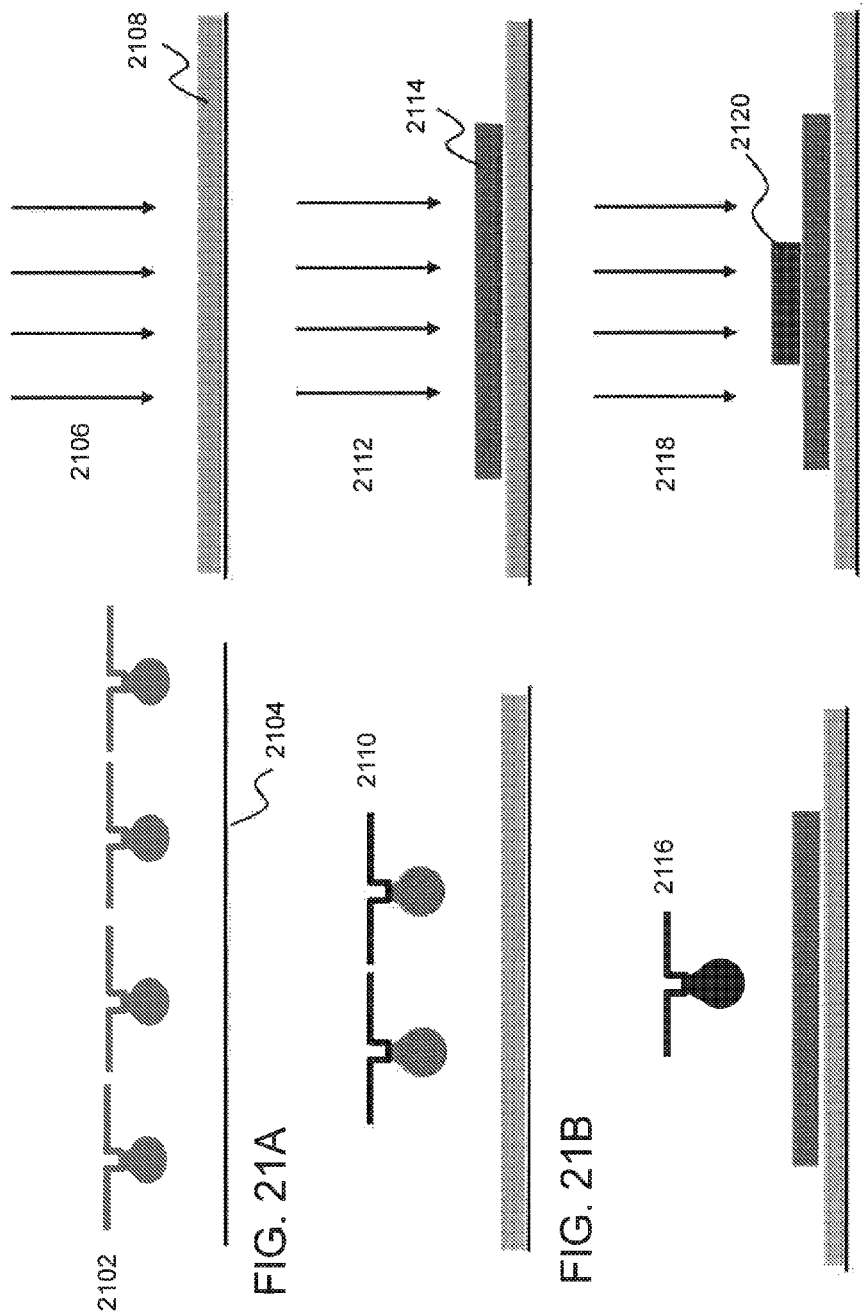
FIG. 21A-21C depicts a method for printing a 3D object in amorphous or polycrystalline silicon.

FIG. 21A-21C depicts a manufacturing process according to yet another embodiment. In this variant, an ink jet printing step 2102 may be used in order to form CPS layer of predetermined shape on a substrate 2104. The CPS layer may be exposed to UV and annealed at temperatures around 200° C. or below in order to form a polysilane coated substrate. Subsequent laser irradiation 2106 of the coating may transform the layer into e.g. a polysilicon layer 2108 by selecting the correct exposure recipe for the pulsed laser. Thereafter, an second and third ink jet step 2110 may be used in order to form a second and a third layer 2114,2120 of a predetermined shape on top of the first layer. By repeating the process multiple times a polycrystalline or amorphous 3D structure may be printed.

Figure 22:
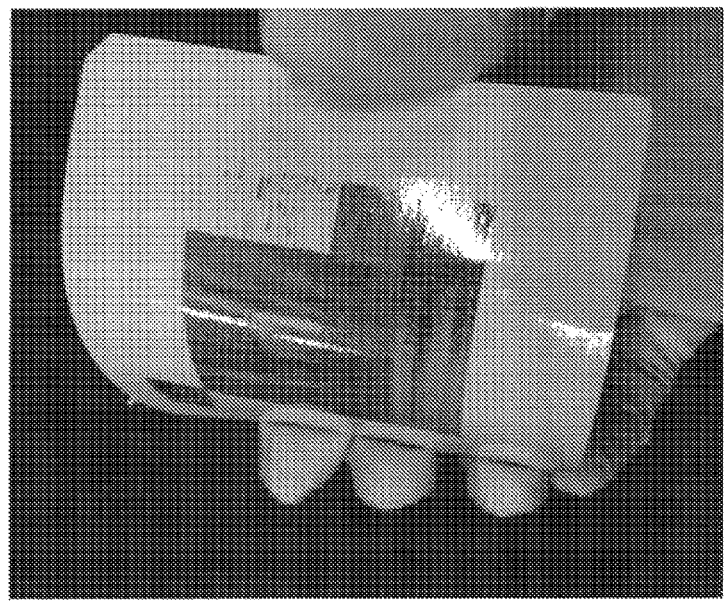
FIG. 22 depicts a photo comprising a flexible sheet of paper comprising a thin-film silicon layer formed thereon using the low-temperature silicon formation method according to the invention.

It is to be understood that any feature described in relation to any one embodiment may be used alone, or in combination with other features described, and may also be used in combination with one or more features of any other of the embodiments, or any combination of any other of the embodiments. The invention is not limited to the embodiments described above, which may be varied within the scope of the accompanying claims. For example, different coating and/or printing techniques may be used to apply a silane layer onto a substrate. Exemplary printing techniques that may be used with the invention include gravure printing, screen printing, flexographic/letterpress printing and/or offset printing. Similarly, exemplary coating techniques that may be used include slot die coating, roller coating, dip coating, air knife coating, etc. Further, other (flexible) substrates than plastic substrates may be used as a support substrate including metallic, fibre-type (woven or non-woven) sheets, paper etc. For example, FIG. 22 comprises a photo comprising a flexible sheet of paper comprising a thin-film silicon layer that formed on the paper substrate using the low-temperature silicon formation process as described within this application.

The invention claimed is:

1. A method for low-temperature formation of silicon, on a substrate comprising:
    forming one or more layers on a substrate using one or more liquid silane compounds;
    exposing at least part of said one or more layers to light, laser light, or one or more laser light pulses, the light, laser light or laser light pulses comprising one or more wavelengths within the range between 100 nm and 800 nm, the exposing directly transforming at least part of said one or more silane compounds into silicon without exposing said substrate to an annealing temperature higher than 250° C., said silicon comprising amorphous, microcrystalline, polycrystalline and/or single crystalline silicon.

2. The method according to claim 1, further comprising:
    exposing at least part of said one or more layers to said light after thermally annealing said one or more layers at a low-temperature between 80 and 250° C., or, exposing said layer to said light without thermally annealing said one or more layers.

3. The method according to claim 1, wherein forming said one or more layers comprises:
    coating at least part of said substrate with a liquid compound comprising at least one liquid cyclic silane compound;
    exposing at least part of said coating to UV light for transforming at least part of said cyclic silane compound into one or more polysilane compounds.

4. The method according to claim 1 wherein the light that is used for transforming at least part of said one or more layers into silicon is generated by a high- or low-pressure mercury lamp, a rare-earth gas discharge lamp or a (pulsed) laser, YAG laser, an argon laser or an excimer laser.

5. The method according to claim 1 wherein exposing at least part of said one or more layers comprises:
   exposing at least part of said one or more said layers to (laser) light, wherein said light has an energy density of at least 75 mJ/cm$^2$ or more in order to transform at least part of said one or more layers into silicon.

6. The method according to claim 1 wherein exposing at least part of said one or more layers comprises:
   exposing at least part of said one or more said layer to one or more laser pulses wherein the energy density of said pulses is selected between 10 and 800 mJ/cm2.

7. The method according to claim 1 wherein exposing at least part of said one or more layers comprises:
   exposing at least part of said one or more said layers to one or more first laser pulses of an energy density selected between 20 and 100 mJ/cm2, and one or more second laser pulses having an energy density selected between 100 and 350 mJ/cm2.

8. The method according to claim 1 wherein at least part of said one or more layers are exposed to one or more laser pulses such that at least part of said silane is transformed in to silicon, amorphous, microcrystalline or polycrystalline silicon, said polycrystalline silicon comprising an average grain size between 5 and 500 nm.

9. The method according to claim 1 wherein forming one or more layers on said substrate comprises:
   coating said substrate with a liquid silane compound or a doped silane compound, said silane compound being defined by the general formula $Si_nX_m$, wherein X is a hydrogen; n is an integer of 5 or greater; and m is an integer equal to n, 2n−2, 2n or 2n+1; said liquid silane compound comprising cyclopentasilane (CPS; $Si_5H_{10}$), cyclohexasilane ($Si_6H_{12}$) and/or neopentasilane ($Si_5H_{12}$); and, said doped liquid silane compound having the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

10. The method according to claim 1 wherein said liquid (poly)silane compound is provided on said substrate in a substantially pure form.

11. The method according to claim 1 wherein said substrate is a plastic substrate, a paper or cellulose based substrate, a (woven) fibre-based substrate, said plastic comprising polyimide, PEN or PET or derivatives thereof.

12. The method according to claim 1 wherein forming said layer on a substrate comprises:
   depositing a liquid semiconductor precursor on said substrate using printing or a coating technique, using an ink jet technique, a doctor blade technique, gravure printing, screen printing, flexographic/letterpress printing and/or offset printing, slot die coating, roller coating, dip coating and/or air knife coating.

13. The method according to claim 1 wherein forming said layer on said substrate comprises:
   forming at least one recess or a nanohole in said substrate, using an imprint technique;
   filling said recess at least part with a liquid silane compound.

14. The method according to claim 1, wherein said one or more layers may be formed by repetitively coating (poly)silane layers on top of each other.

15. The method according to claim 1, wherein the thickness of said one or more layers is selected between 100 nm and 20 micron.

16. The use of the method according to claim 1 in the manufacturer of a semiconducting device, a thin-film transistor or a photovoltaic cell.

17. The method according to claim 1, wherein the thickness of said one or more layers is selected between 200 nm and 10 micron.

* * * * *